(12) United States Patent
Son et al.

(10) Patent No.: US 7,700,461 B2
(45) Date of Patent: Apr. 20, 2010

(54) METHODS OF LATERALLY FORMING SINGLE CRYSTALLINE THIN FILM REGIONS FROM SEED LAYERS

(75) Inventors: Yong-Hoon Son, Yongin-si (KR);
Si-Young Choi, Seongnam-si (KR);
Jong-Wook Lee, Yongin-si (KR);
Pil-Kyu Kang, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 12/061,253

(22) Filed: Apr. 2, 2008

(65) Prior Publication Data
US 2008/0194083 A1    Aug. 14, 2008

Related U.S. Application Data

(63) Continuation-in-part of application No. 11/378,731, filed on Mar. 17, 2006, now Pat. No. 7,459,353.

(30) Foreign Application Priority Data

Apr. 9, 2007   (KR) ............................... 2007-34559
Jun. 11, 2007  (KR) ............................... 2007-56578

(51) Int. Cl.
*H01L 21/20* (2006.01)
(52) U.S. Cl. ............................... 438/486; 257/E21.132
(58) Field of Classification Search .................. 438/486; 257/E21.132
See application file for complete search history.

(56) References Cited

U.S. PATENT DOCUMENTS 5,972,105 A    10/1999    Yamazaki et al.

(Continued)

FOREIGN PATENT DOCUMENTS

JP    2001-171333    12/2002

(Continued)

OTHER PUBLICATIONS

Korean Notice to Submit A Response with the English translation (10 pages) corresponding to Korean Application No. 2007-34559; Dated Aug. 22, 2008.

*Primary Examiner*—Charles D Garber
*Assistant Examiner*—Stanetta D Isaac
(74) *Attorney, Agent, or Firm*—Myers Bigel Sibley & Sajovec, P.A.

(57) ABSTRACT

In a method of manufacturing a semiconductor device, a string structure including a selection transistor and a memory cell on a substrate. An insulation layer pattern is formed on the substrate to cover the string structure. The insulation layer pattern includes at least one opening exposing a portion of the substrate adjacent to the selection transistor. A seed layer including a single-crystalline material is formed in the opening. An amorphous thin film including an amorphous material is formed on the insulation layer pattern and the seed layer. The amorphous thin film is transformed into a single-crystalline thin film, using the single-crystalline material in the seed layer as a seed during a phase transition of the amorphous thin film, to form a channel layer on the insulation layer pattern and the seed layer. Therefore, the semiconductor device including the channel layer having the single-crystalline thin film may be manufactured.

17 Claims, 15 Drawing Sheets

U.S. PATENT DOCUMENTS

| | | |
|---|---|---|
| 6,645,454 B2 | 11/2003 | Voutsas |
| 6,767,804 B2 | 7/2004 | Crowder |
| 6,812,504 B2 * | 11/2004 | Bhattacharyya ............. 257/133 |
| 7,537,980 B2 * | 5/2009 | Son et al. .................... 438/151 |
| 2004/0018672 A1 * | 1/2004 | Bohr .......................... 438/166 |
| 2005/0277235 A1 * | 12/2005 | Son et al. .................... 438/166 |
| 2006/0049409 A1 | 3/2006 | Rafferty et al. |

FOREIGN PATENT DOCUMENTS

| | | |
|---|---|---|
| JP | 2006-104053 | 8/2006 |
| KR | 10-2002-0047228 A | 6/2002 |
| KR | 10-2004-0108031 B1 | 5/2006 |
| KR | 578787 | 5/2006 |
| KR | 10-2005-0022509 B1 | 7/2006 |
| KR | 10-2005-0079773 B1 | 9/2006 |
| KR | 10-2005-0032006 A | 10/2006 |

* cited by examiner

METHODS OF LATERALLY FORMING SINGLE CRYSTALLINE THIN FILM REGIONS FROM SEED LAYERS

CROSS-REFERENCE TO RELATED APPLICATIONS

This application is a continuation-in-part of U.S. patent application Ser. No. 11/378,731, filed on Mar. 17, 2006 now U.S. Pat. No. 7,459,353. This application also claims priority under 35 U.S.C. §119 to Korean Patent Application No. 2007-34559, filed on Apr. 9, 2007, and Korean Patent Application No. 2007-56578, filed on Jun. 11, 2007 in the Korean Intellectual Property Office (KIPO), the contents of which are herein incorporated by reference in their entireties.

BACKGROUND OF THE INVENTION

1. Field of the Invention

Example embodiments of the present invention relate to a method of manufacturing a semiconductor memory device. More particularly, example embodiments of the present invention relate to a method of manufacturing a semiconductor device including a single-crystalline thin film transformed from an amorphous thin film having an amorphous material.

2. Description of the Related Art

Materials are generally divided into single-crystalline materials, polycrystalline materials and amorphous materials. A single-crystalline material is one that has a single crystal unit structure, while a polycrystalline material has a structure including a plurality of crystal units. An amorphous material may not include a defined crystal structure, as atoms in the amorphous material may be irregularly bonded to each other. The polycrystalline material typically has many grain boundaries due to the plurality of crystal structure units. The movement of carriers, such as electrons or holes, may be restricted in the polycrystalline material by such grain boundaries. To reduce and/or to minimize such reductions in carrier mobility, a single-crystalline silicon thin film is often used as an active region of a semiconductor device including a thin-film transistor (TFT) having a stacked structure, an active region of a system-on-chip (SOC) device or an active region of a NAND flash memory device. The single-crystalline silicon thin film may include a high density of large single-crystalline grains.

The present inventors filed Korean Patent Application No. 2005-22509 on Mar. 18, 2005, which describes a method of forming a single-crystalline silicon thin film from an amorphous silicon thin film, and which was registered as Korean Patent No. 599,043 on Jul. 4, 2006.

In Korean Patent No. 599,043, an amorphous silicon thin film is formed on a seed layer including single-crystalline silicon, and then a laser beam is irradiated onto the amorphous silicon thin film so as to change the amorphous silicon thin film into the single-crystalline silicon thin film. A single-crystalline silicon thin film, which has a high density of relatively large single-crystalline grains, may be easily formed by the above-described method. FIG. 1 is a cross-sectional view illustrating a semiconductor device including a single-crystalline silicon thin film by a conventional method.

Referring to FIG. 1, Korean Patent No. 599,043 discloses the method of forming a single-crystalline silicon thin film 32 serving a channel layer employed only in a volatile memory device, such as a dynamic random access memory (DRAM) device, and not in a non-volatile memory device, such as a NAND flash memory device. Further, in Korean Patent No. 599,043, the amorphous silicon thin film may be transformed using silicon included in one seed layer 28 as a seed into the single-crystalline silicon thin film having a sufficiently enlarged width. However, when the amorphous silicon thin film is spaced apart from the seed layer 32 by a distance of over about 4 to about 5 μm, it may be difficult to form the single-crystalline silicon thin film 32 having uniform characteristics.

When the seed layer 28 is formed on a substrate 10 by a selective epitaxial growth process, defects D may occur in the seed layer 28 due to a thermal budget or a sidewall of an insulation layer pattern 16. The defects D may have an orientation in the crystallographic (111) direction. When the amorphous silicon thin film is transformed using the seed layer 28 as a seed to form the single-crystalline silicon thin film 32 that may serve as a channel layer, an upper portion of the single-crystalline silicon thin film 32 may include the defects D being oriented in the crystallographic (111) direction. Since the defects D having an orientation of about 54.7° from a crystallographic point of view of the cubic structure is transcribed from the seed layer 28 into the single-crystalline silicon thin film 32, the single-crystalline silicon thin film 32 having a relatively thin thickness may also include the defects D at the upper portion thereof.

SUMMARY OF THE INVENTION

Example embodiments of the present invention provide a method of manufacturing a semiconductor device including a channel layer having a uniform single-crystalline structure using one seed layer formed relative to one unit string.

Example embodiments of the present invention provide a method of manufacturing a semiconductor device including a channel layer having an upper portion free from defects.

According to one aspect of the present invention, there is provided a method of manufacturing a semiconductor device. In the method of manufacturing the semiconductor device, a string structure including a selection transistor and a memory cell is formed on a substrate. An insulation layer pattern is formed on the substrate to cover the string structure. The insulation layer pattern includes at least one opening exposing a portion of the substrate adjacent to the selection transistor. A seed layer including a single-crystalline material is formed in the opening. An amorphous thin film including an amorphous material is formed on the insulation layer pattern and the seed layer. The amorphous thin film is transformed into a single-crystalline thin film, using the single-crystalline material in the seed layer as a seed during a phase transition of the amorphous thin film, to form a channel layer on the insulation layer pattern and the seed layer.

In some example embodiments, the substrate may include the single-crystalline structure and the substrate may include a silicon substrate, a silicon-on-insulator (SOI) substrate, a germanium substrate, or a silicon-germanium substrate.

In some example embodiments, the seed layer may be formed by filling the opening with an amorphous material and transforming a crystal structure of the amorphous material into a single-crystalline structure using the substrate as a seed.

In some example embodiments, one opening may be formed relative to one unit string. Here, a plurality of openings may be spaced apart from each other by a distance of about 3 to about 5 μm.

In some example embodiments, the seed layer may be formed from the substrate exposed through the opening by a selective epitaxial growth process.

In some example embodiments, the channel layer may be formed by changing a phase of a first region of the amorphous thin film, the first region of the amorphous thin film being overlapped with the seed layer; transforming the first region of the amorphous thin film into a first single-crystalline thin film including the single-crystalline material, by converting a crystalline structure of the first region of the amorphous thin film into a single-crystalline structure, using the single-crystalline material in the seed layer as a seed during a phase transition of the first region of the amorphous thin film; changing a phase of a second region of the amorphous thin film, the second region of the amorphous thin film being laterally adjacent to the first single-crystalline thin film; and transforming the second region of the amorphous thin film into a second single-crystalline thin film including the single-crystalline material, by converting a crystalline structure of the second region of the amorphous thin film into a single-crystalline structure, using the single-crystalline material in the first single-crystalline thin film as a seed during a phase transition of the second region of the amorphous thin film. Here, the phases of the first and second regions of the amorphous thin film may be changed by melting the amorphous thin film by irradiating a laser beam onto the amorphous thin film. Further, the first region of the amorphous thin film may have an area substantially larger than that of the second region of the amorphous thin film. In addition, the channel layer may be formed by changing a phase of an Nth (N is an integer greater than 3) region of the amorphous thin film laterally adjacent to the second single-crystalline thin film, and transforming the Nth region of the amorphous thin film into an Nth single-crystalline thin film including the single-crystalline material, by converting a crystalline structure of the Nth region of the amorphous thin film into a single-crystalline structure, using the single-crystalline material in an (N−1)th single-crystalline thin film as a seed during a phase transition of the Nth region of the amorphous thin film. Here, the second region of the amorphous thin film may have an area substantially larger than that of the Nth region of the amorphous thin film.

In some example embodiments, the portion of the substrate exposed through the opening may correspond to a region for forming a common source line of the unit string.

According to another aspect of the present invention, there is provided a method of manufacturing a semiconductor device. In the method of manufacturing the semiconductor device, a first string structure including a selection transistor and a memory cell is formed on a single-crystalline substrate. A first insulation layer pattern is formed on the single-crystalline substrate to cover the first string structure. The first insulation layer pattern includes at least one opening exposing a portion of the single-crystalline substrate adjacent to the selection transistor. A first seed layer including a single-crystalline material is formed in the opening. An amorphous thin film is formed on the first insulation layer pattern and the first seed layer. The amorphous thin film is transformed into a single-crystalline thin film, using the single-crystalline material in the first seed layer as a seed during a phase transition of the amorphous thin film, to form a channel layer including the single-crystalline thin film on the first insulation layer pattern and the first seed layer. After the first seed layer is removed from the first insulation layer pattern, a conductive line having a conductive material is formed in the opening.

In some example embodiments, second to Rth (R is an integer greater than 3) string structures including a plurality of memory cells, second to Pth (P is an integer greater than 3) insulation layer patterns including openings substantially the same as the first insulation layer pattern, second to Mth (M is an integer greater than 3) seed layers substantially the same as the first seed layer, second to Kth (K is an integer greater than 3) amorphous thin films substantially the same as the first amorphous thin film, and second to Jth (J is an integer greater than 3) channel layers substantially the same as the first channel layer, may be repeatedly formed on the first channel layer.

According to still another aspect of the present invention, there is provided a method of manufacturing a semiconductor device. In the method of manufacturing the semiconductor device, a first insulation layer pattern having a first opening is formed on a single-crystalline substrate. A seed layer including a single-crystalline material is formed in the first opening. A first amorphous thin film including an amorphous material is formed on the first insulation layer pattern and the seed layer. A phase of the first amorphous thin film is changed to form a first channel layer on the first insulation layer pattern and the seed layer. A second insulation layer pattern including a second opening exposing the first channel layer is formed on the first channel layer, when defects occur in the first channel layer. A second amorphous thin film filling the second opening is formed. A phase of the second amorphous thin film is changed, using the first channel layer having the defects as a seed during a phase transition of the second amorphous thin film, to form a second channel layer having an upper portion free from the defects.

In some example embodiments, the first channel layer may be formed by changing the phase of the first amorphous thin film and transforming a crystalline structure of the first amorphous thin film into a single-crystalline structure, using the single-crystalline material in the seed layer as a seed during a phase transition of the first amorphous thin film. Here, the phase of the first amorphous thin film may be changed by melting the first amorphous thin film by irradiating a laser beam onto the first amorphous thin film.

In some example embodiments, the second opening may have an aspect ratio of about 1:2 to about 1:5.

In some example embodiments, the second channel layer may include the lower portion having the defects transcribed from the defects that have an orientation in the crystallographic (111) direction in an upper portion of the first channel layer, and an upper portion free from the defects.

In some example embodiments, the second channel layer may be formed by changing a phase of the second amorphous thin film and transforming a crystalline structure of the second amorphous thin film into a single-crystalline structure, using the single-crystalline material in the first channel layer as a seed during a phase transition of the second amorphous thin film.

In some example embodiments, the phase of the second amorphous thin film may be changed by melting the second amorphous thin film by irradiating a laser beam onto the second amorphous thin film.

According to still another aspect of the present invention, there is provided a method of manufacturing a semiconductor device. In the method of manufacturing the semiconductor device, a first insulation layer pattern having a first opening is formed on a single-crystalline substrate including a first memory cell structure. A seed layer including a single-crystalline material is formed in the first opening. A first amorphous thin film including an amorphous material is formed on the first insulation layer pattern and the seed layer. A phase of the first amorphous thin film is changed using the single-crystalline materiel in the seed layer as a seed to form a first channel layer including the single-crystalline material on the first insulation layer pattern and the seed layer. A second insulation layer pattern including a second opening exposing the first channel layer is formed on the first channel layer, when defects occur in the first channel layer. A second amorphous thin film filling the second opening is formed. A phase of the second amorphous thin film is changed, using the first channel layer having the defects as a seed during a phase transition of the second amorphous thin film, to form a second channel layer having a lower portion free from the defects. A second memory cell structure is formed on the second channel layer.

In some example embodiments, a third insulation layer pattern including a third opening exposing the second channel layer may be formed on the second channel layer. A third amorphous thin film filling the third opening may be formed. A phase of the third amorphous thin film may be changed, using the second channel layer as a seed during a phase transition of the third amorphous thin film, to form a third channel layer having an upper portion free from the defects. A third memory cell structure may be formed on the third channel layer.

In some example embodiments, fourth to Pth (P is an integer greater than 5) insulation layer patterns including openings substantially the same as the third insulation layer pattern, fourth to Jth (J is an integer greater than 5) channel layers substantially the same as the third channel layer, and fourth to Kth (K is an integer greater than 5) memory cell structures substantially the same as the third memory cell structure, may be repeatedly formed on the third channel layer.

According to the present invention, a single-crystalline thin film including dense and large grains, which may serve as a channel layer for a NAND flash memory device, may be formed by a simple process using one seed formed relative to one unit string. Further, when a first channel layer for forming a memory cell has defects, the first channel layer may not be utilized. Instead of the first channel layer, a second channel layer free from the defects may be formed on the first channel layer by a laser epitaxial growth process. A phase of an amorphous thin film filling an opening of an insulation layer pattern is changed by the laser epitaxial growth process to form the second channel layer so that the defects may not be transcribed up to an upper portion of the second channel layer due to a transcription angle of the defects included in the first channel layer.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
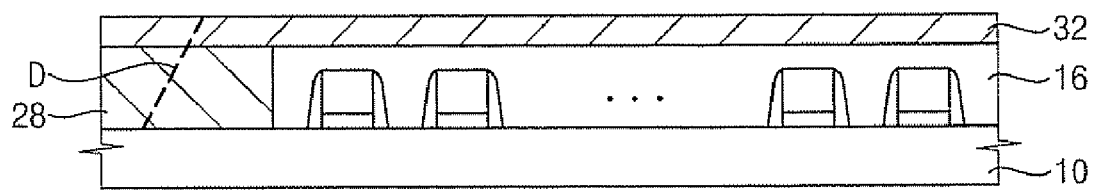
FIG. 1 is a cross-sectional view illustrating a single-crystalline silicon thin film manufactured by a conventional method.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A to 2D are cross-sectional views illustrating methods of manufacturing a semiconductor device in accordance with example embodiments of the present invention. FIGS. 3A to 3D are plan views illustrating methods of manufacturing the semiconductor device shown in FIGS. 2A to 2D in accordance with example embodiments of the present invention.

Figure 2A:
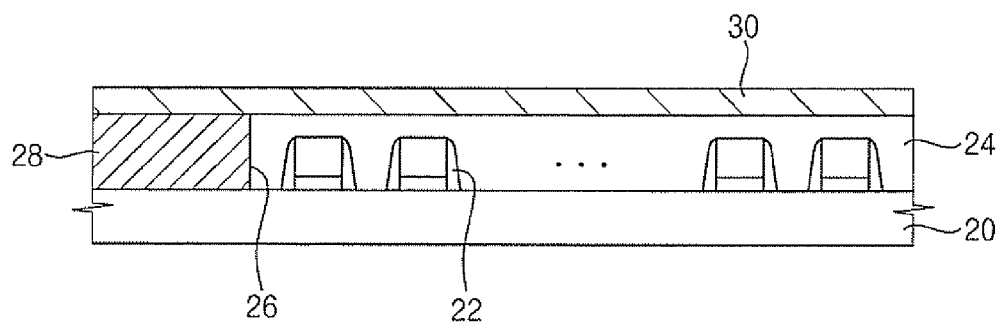
FIGS. 2A to 2D are cross-sectional views illustrating methods of manufacturing a semiconductor device in accordance with example embodiments of the present invention.
Figure 3A:
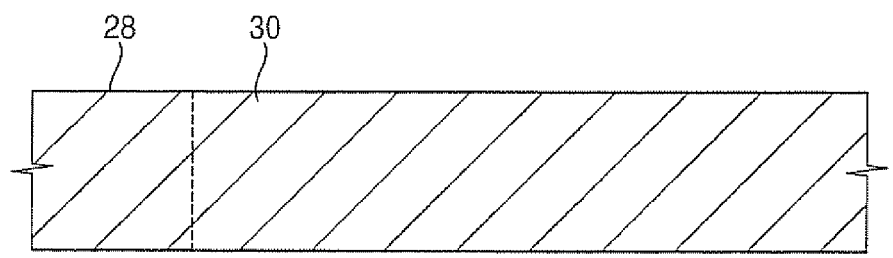
FIGS. 3A to 3D are plan views illustrating methods of manufacturing the semiconductor device shown in FIGS. 2A to 2D in accordance with example embodiments of the present invention.

Referring to FIGS. 2A and 3A, a first single-crystalline structure 20 including a single-crystalline material is provided. The single-crystalline material may include single-crystalline silicon, single-crystalline germanium, etc. In one example embodiment of the present invention, the first single-crystalline structure 20 may include a silicon substrate, a silicon-on-insulator (SOI) substrate, a germanium substrate, a silicon-germanium substrate, etc. In another example embodiment of the present invention, the first single-crystalline structure 20 may include a single-crystalline thin film formed from an amorphous thin film through a phase transition process. The first single-crystalline structure 20 may include the silicon substrate.

A first semiconductor structure 22 is formed on the first single-crystalline structure 20. The first semiconductor structure 22 may include a transistor, a metal wiring, a logic element, etc. The first semiconductor structure 22 may further include various elements in accordance with a type of a semiconductor device.

A first insulation layer 24 is formed on the first single-crystalline structure 20 to cover the first semiconductor structure 22. The first insulation layer 24 may be formed using an oxide such as silicon oxide. For example, the first insulation layer 24 may be formed using undoped silicate glass (USG), spin-on glass (SOG), high-density plasma chemical vapor deposition (HDP-CVD) oxide, flowable oxide (FOx), tetraethylorthosilicate (TEOS), plasma-enhanced tetraethylorthosilicate (PE-TEOS), phosphosilicate glass (PSG), borophosphosilicate glass (BPSG), etc.

The first insulation layer 24 is partially etched to thereby form an opening 26 exposing the first single-crystalline structure 20. The opening 26 may be formed using a photoresist pattern as an etching mask after the photoresist pattern is formed on the first insulation layer 24. In one example embodiment of the present invention, one opening 26 may be formed relative to one first single-crystalline structure 20. In another embodiment of the present invention, one opening 26 may be formed relative to one unit cell of the semiconductor device.

A first seed layer 28 is formed on the first single-crystalline structure 20 in the opening 26. The first seed layer 28 may be formed by a selective epitaxial growth (SEG) process. For example, the first seed layer 28 may be formed by a liquid-phase epitaxy (LPE) process, a vapor-phase epitaxy (VPE) process, a molecular-beam epitaxy (MBE) process, etc. In one embodiment, the first seed layer 28 may be formed by the VPE process.

In the SEG process, the first seed layer 28 grows from a surface of the first single-crystalline structure 20 exposed through the opening 26 so that the first seed layer 28 may have a crystalline structure substantially the same as that of the first single-crystalline structure 20. When the first single-crystalline structure 20 includes the silicon substrate, the first seed layer 28 may include single-crystalline silicon.

In an example embodiment of the present invention, the opening 26 may be filled with the first seed layer 28. In other words, the first seed layer 28 may have a thickness substantially the same as that of the first insulation layer 24. The first seed layer 28 may be positioned on the first insulation layer 24 around the opening 26. The first seed layer 28 may be polished to remove a portion of the first seed layer 28 formed on the first insulation layer 28 around the opening 26. The first seed layer 28 may be partially removed by a chemical mechanical polishing (CMP) process.

After the first seed layer 28 filling up the opening 26 is formed, a first amorphous thin film 30 is formed on the first insulation layer 24 and the first seed layer 28. The first amorphous thin film 30 may include an amorphous material. When the first single-crystalline structure 20 includes the silicon substrate, the first amorphous silicon thin film 30 may include amorphous silicon. Alternatively, when the first single-crystalline structure 20 includes the germanium substrate, the first amorphous silicon thin film 30 may include amorphous germanium. Furthermore, when the first single-crystalline structure 20 includes the silicon-germanium substrate, the first amorphous silicon thin film 30 may include amorphous silicon-germanium.

The first amorphous thin film 30 may be formed by a chemical vapor deposition (CVD) process. The first amorphous thin film 30 may have a relatively thin thickness; however, the thickness of the first amorphous thin film 30 may vary as occasion demands.

Figure 2B:
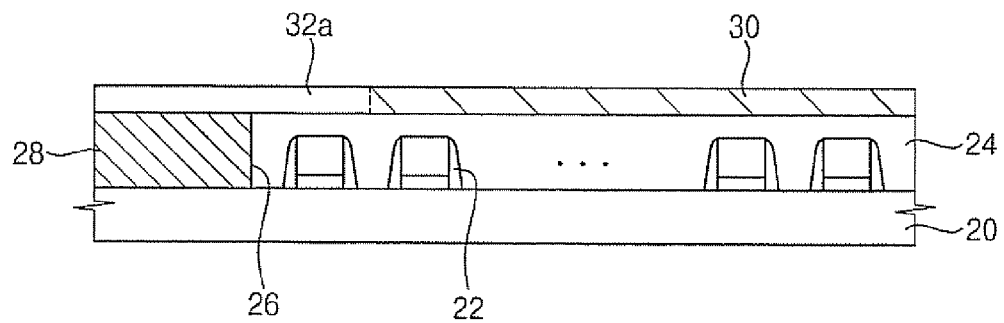
Figure 3B:
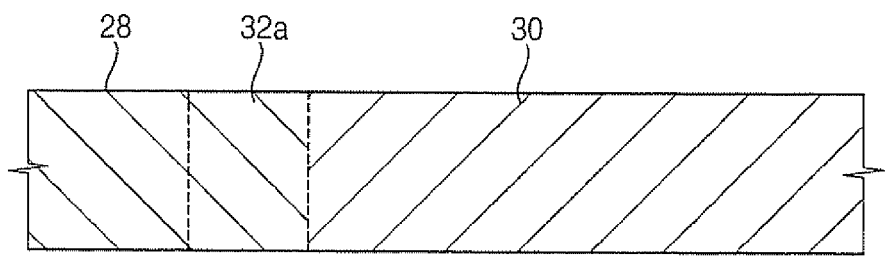

Referring to FIGS. 2B and 3B, a phase of a first region of the first amorphous thin film 30 is changed. That is, the first amorphous thin film 30 is partially phase-changed. The first region of the first amorphous thin film 30 includes a portion of the first amorphous thin film 30 overlapped (in direct contact with) with the first seed layer 28. When the first region of the first amorphous thin film 30 is phase-changed, the single-crystalline material in the first seed layer 28 may serve as a seed. After the phase transition process of the first amorphous thin film 30, the first region of the first amorphous thin film 30 has a liquid phase changed from a solid phase. The phase of the first region of the first amorphous thin film 30 may be changed by partially melting the first amorphous thin film 30.

As appreciated by the present inventors, if the first amorphous thin film 30 is partially melted by a thermal treatment process using a furnace, the first semiconductor structure 22 may sustain serious damage because the thermal treatment process is performed at a high temperature. Additionally, the first region of the first amorphous thin film 30 may not be easily melted using the furnace. Therefore, the first region of the first amorphous thin film 30 may be advantageously melted by impinging or irradiating a laser beam (i.e., laser light) onto the first region of the first amorphous thin film 30.

When the phase transition of the first region of the first amorphous thin film 30 occurs in accordance with the irradiation of the laser beam, the first region of the first amorphous thin film 30 may have a single-crystalline structure based on the single-crystalline material in the first seed layer 28 serving as the seed. A transformation of the crystalline structure of the first region of the first amorphous thin film 30 may proceed along a vertical direction and a horizontal direction. Since the phase transition and the crystalline structure transformation of the first region of the first amorphous thin film 30 may occur for several nanoseconds, the first region of the first amorphous thin film 30 may not flow down from the first seed layer 28 even though the phase of the first region of the first amorphous thin film 30 is changed into the liquid phase from the solid phase.

The laser beam irradiated onto the first amorphous thin film 30 may have sufficient energy to melt the entire first amorphous thin film 30 based on the thickness of the first amorphous thin film 30 because the liquid phase is generated from a surface of the first region of the first amorphous thin film 30 to an interface between the first region of the first amorphous thin film 30 and the first seed layer 28. The energy of the laser beam may mainly vary in accordance with the thickness of the first amorphous thin film 30. When the first amorphous thin film 30 includes the amorphous silicon, the laser beam may have energy capable of generating a temperature of above about 1,410° C., while taking into consideration that the melting point of the amorphous silicon is about 1,410° C.

Meanwhile, the first seed layer 28 may not be substantially affected by the irradiation of the laser beam because the first seed layer 28 has an absorption coefficient different from that of the first amorphous thin film 30 even though the phase of the first region of the first amorphous thin film 30 is changed.

In an example embodiment of the present invention, the first single-crystalline structure 20 may be thermally treated while the phase of the first region of the first amorphous thin film 30 is changed. In the thermal treatment process for the first region of the first amorphous thin film 30, a temperature gradient in the first region of the first amorphous thin film 30 may decrease so that larger single-crystalline grains may be formed at the irradiated portion of the first amorphous thin film 30. When the first single-crystalline structure 20 is heated at a temperature of below about 200° C., the grains in the first region of the first amorphous thin film 30 may have limited sizes. When the thermal treatment process is performed at a temperature of above about 600° C., a proper apparatus for heating the first single-crystalline structure 20 may not be equipped. Therefore, the first single-crystalline structure 20 may be advantageously heated at a temperature of about 200 to about 600° C. For example, the first single-crystalline structure 20 may be thermally treated at a temperature of about 350 to about 450° C.

The single-crystalline materials in the first seed layer 28 serve as the seeds in the phase transition of the first region of the first amorphous thin film 30 so that the first region of the first amorphous thin film 30 has the single-crystalline structure after the phase of the first region of the first amorphous thin film 30 is changed. As a result, the first region of the first amorphous thin film 30 is converted into a first single-crystalline thin film 32a. In an example embodiment of the present invention, the first seed layer 28 includes single-crystalline silicon and the first amorphous thin film 30 includes amorphous silicon so that the first single-crystalline thin film 32a includes single-crystalline silicon.

In an example embodiment of the present invention, since the phase transition of the first region of the first amorphous thin film 30 may occur for several nanoseconds, the first single-crystalline layer 32a formed through the phase transition process may not have defects therein. Further, the grains in the first single-crystalline thin film 32a may be easily enlarged because the first seed layer 28 including the single-crystalline material serves as the seed. That is, when the first seed layer 28 serves as the seed and the phase of the first region of the first amorphous thin film 30 is changed, the first single-crystalline thin film 32a may include dense and large grains.

The laser light may be impinged onto the first amorphous thin film 30 (and other amorphous thin films) in a continuous fashion or using discrete steps. For example, in a continuous application, the laser light may be initially applied to the first region of the amorphous thin film 30 above the seed layer 28 and moved continuously across the amorphous thin film 30 away from the seed layer 28 at a rate that allows for sufficient heating to provide for the phase change of the amorphous layer into the single-crystalline thin films corresponding to the first and other regions.

In some embodiments of the present invention, the laser light may be moved in discrete steps according to a predetermined pattern according to the locations of the regions. In still other embodiments according to the invention, the laser light may be moved continuously and activated/deactivated at the appropriate intervals according to the discrete pattern. Further, the laser beam may be "moved" by, for example, moving a mirror above the amorphous thin film 30 to reflect the laser light. Alternatively, the laser that generates the laser beam may be moved above the amorphous thin film 30.

In some embodiments of the present invention, the substrate may be moved beneath a "fixed" laser light. Alternatively, the substrate may be moved beneath a fixed laser light continuously along one axis, with activation of the laser light being synchronized with the regions of the amorphous thin film 30. The laser light may be impinged in a single pulse or a number of pulses delivered to each region.

Figure 2C:
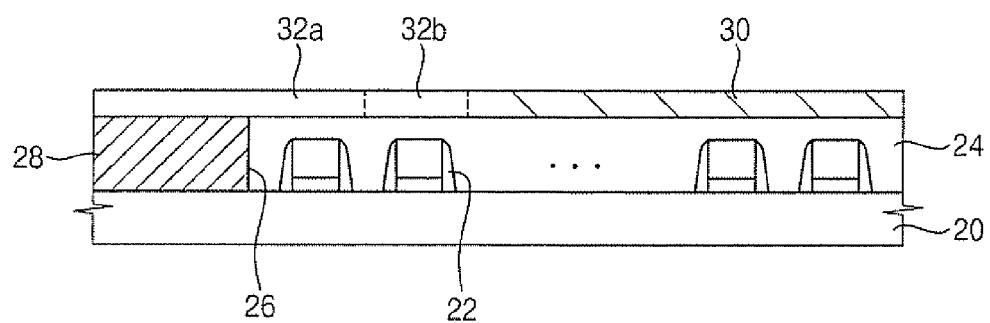
Figure 3C:
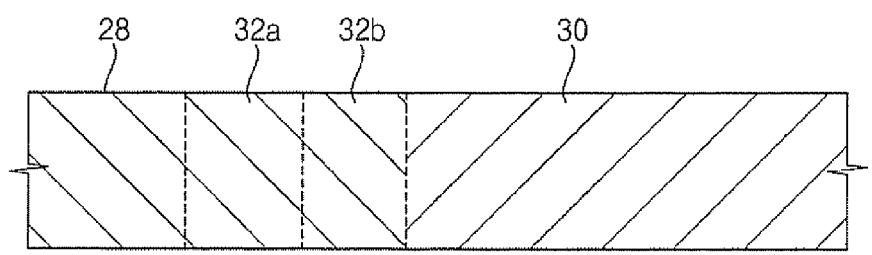

Referring to FIGS. 2C and 3C, a phase of a second region of the first amorphous thin film 30 adjacent to the first single-crystalline thin film 32a is changed. The phase transition process for the second region of the first amorphous thin film 30 may be substantially the same as the phase transition process for the first region of the first amorphous thin film 30 described with reference to FIGS. 2B and 3B except that the first single-crystalline thin film 32a serves as a seed and the second region of the first amorphous thin film 30 has an area substantially smaller than that of the first region of the first amorphous thin film 30.

When the phase of the second region of the first amorphous thin film 30 is changed to convert a crystalline structure of the second region of the first amorphous thin film 30, the first single-crystalline thin film 32a serves as the seed so that the second region of the first amorphous thin film 30 may have the area substantially smaller than that of the first region of the first amorphous thin film 30.

In one example embodiment of the present invention, after a laser beam is irradiated from the first region of the first amorphous thin film 30 to the second region of the first amorphous thin film 30, the phase of the second region of the first amorphous thin film 30 may be changed by irradiating the laser beam onto the second region of the first amorphous thin film 30. In another embodiment of the present invention, the laser beam may be continuously irradiated from the first region to the second region of the first amorphous thin film 30 to thereby continuously change the phases of the first and the second regions of the first amorphous thin film 30. Thus, the first and the second regions of the first amorphous thin film 30 may be partially overlapped with each other rather than the first region is separated from the second region.

When the phase of the second region of the first amorphous thin film 30 is changed, the first single-crystalline thin film 32a serves as the seed so that the second region of the first amorphous thin film 30 has a single-crystalline structure. Therefore, the second region of the first amorphous thin film 30 is changed into a second single-crystalline thin film 32b including a single-crystalline material. In an example embodiment of the present invention, since the first single-crystalline thin film 32a includes single-crystalline silicon, the second single-crystalline thin film 32b may also include single-crystalline silicon.

Figure 2D:
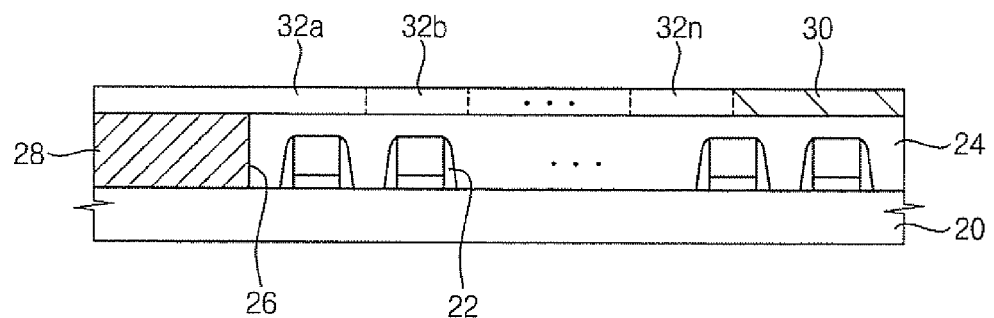
Figure 3D:
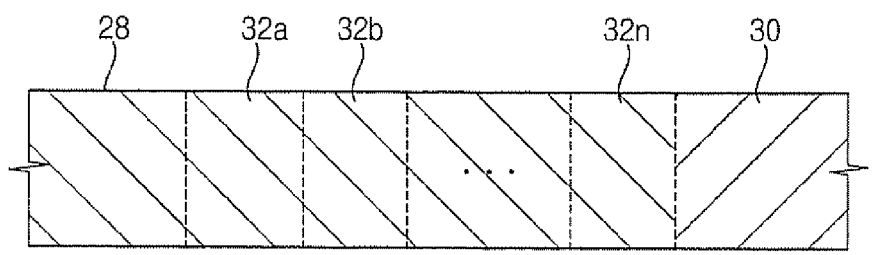

Referring to FIGS. 2D and 3D, a phase of a third region of the first amorphous thin film 30 adjacent to the second single-crystalline thin film 32b to a phase of an Nth (N is a positive integer) region of the first amorphous thin film 30 adjacent to an (N−1)th region of the first amorphous thin film 30 are sequentially changed.

The third region of the first amorphous thin film 30 may have an area substantially smaller than that of the second region of the first amorphous thin film 30, and the Nth region of the first amorphous thin film 30 may have an area substantially smaller than that of the (N−1)th region of the first amorphous thin film 30 because the single-crystalline thin films previously formed serve as seeds as described above. Further, a laser beam may be continuously irradiated onto all of the regions of the first amorphous thin film 30 when the phases of all the regions of the first amorphous thin film 30 are changed. Although an irradiation speed of the laser beam from the first region to the Nth region of the first amorphous thin film 30 may vary, the laser beam may be irradiated from the first to the Nth regions of the first amorphous thin film 30 for sufficient times so as to sufficiently melt each of the first to the Nth regions of the first amorphous thin film 30.

When the phase of the third region of the first amorphous thin film 30 is changed, the second single-crystalline thin film 32b serves as the seed so that the third region of the first amorphous thin film 30 may have the single-crystalline structure. Thus, the third region of the first amorphous thin film 30 may be converted into a third single-crystalline thin film (not shown). Similarly, when the phase of the Nth region of the first amorphous thin film 30 is changed, an (N−1)th single-crystalline thin film formed from the Nth region serves as a seed so that the Nth region of the first amorphous thin film 30 may also have a single-crystalline structure. As a result, the Nth region of the first amorphous thin film 30 may be converted into an Nth single-crystalline thin film 32n.

In an example embodiment of the present invention, the phases of the regions of the first amorphous thin film 30 on the first insulation layer 24 may be continuously changed using the first seed layer 28 serving as the seed, and the crystalline structures of the regions of the first amorphous thin film 30 may be converted into the single-crystalline structures using the single-crystalline thin films previously formed to serve as the seeds so that a second single-crystalline structure including the first single-crystalline thin film 32a to the Nth single-crystalline thin film 32n may be formed on the first insulation layer 24. Therefore, only one seed layer may be sufficiently employed as the seed in order to form the second single-crystalline structure on the first insulation layer 24.

Further, the second single-crystalline structure may have sufficiently enlarged grains and the second single-crystalline structure may be formed with ease in a region in which the first seed layer 28 may not be easily formed such as a peripheral region.

In an example embodiment of the present invention, the single-crystalline structures including dense and large grains and fewer grain boundaries may be formed. Furthermore, the single-crystalline structures may be easily formed in desired regions. Therefore, the method of forming the single-crystalline structure in accordance with an embodiment of the present invention may be advantageously employed in a process of forming a channel layer having a stacked structure.

Figure 4:
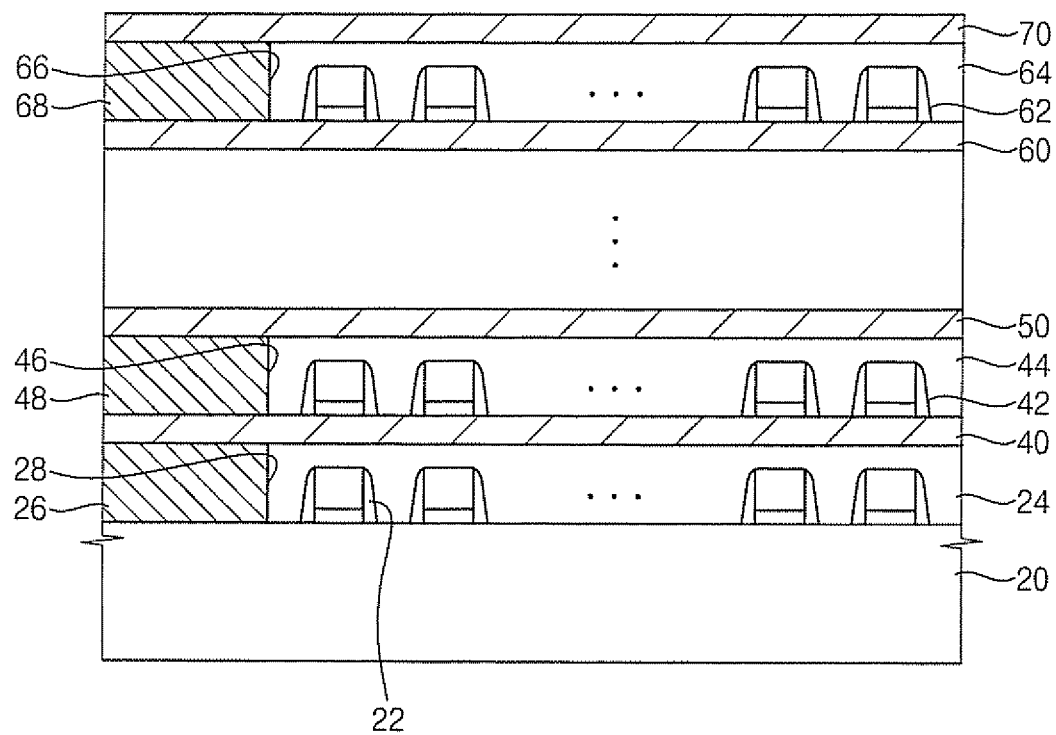
FIG. 4 is a cross-sectional view illustrating methods of manufacturing a semiconductor device in accordance with example embodiments of the present invention.

FIG. 4 is a cross-sectional view illustrating a method of manufacturing a semiconductor device in accordance with an example embodiment of the present invention.

Referring to FIG. 4, a second single-crystalline structure 40 serving as a seed is formed on a first single-crystalline structure 20, such as a silicon substrate, through processes substantially the same as those described with reference to FIGS. 2A to 2D. The second single-crystalline structure 40 may include a first single-crystalline thin film 32a to an Nth single-crystalline thin film 32n as shown in FIGS. 2A to 2D.

A second semiconductor structure 42 is formed on the second single-crystalline structure 40 using the second single-crystalline structure 40 as a channel layer. The second semiconductor structure 42 may include a transistor, a metal wiring, a logic element, etc. The second semiconductor structure 42 may further include various elements in accordance with a type of a semiconductor device as described above.

A second insulation layer 44, an opening 46 and a second seed layer 48, which are substantially the same as the first insulation layer 24, the opening 26 and the first seed layer 28 in FIGS. 2A to 2D, respectively, are formed on the second single-crystalline structure 40 including the second semiconductor structure 42. A second amorphous thin film substantially the same as the first amorphous thin film 30 in FIGS. 2A to 2D may be formed on the second insulation layer 44 and the second seed layer 48. The second amorphous thin film may be converted into a third single-crystalline structure 50 by processes substantially the same as the processes for forming the second single-crystalline structure 40 described with reference to FIGS. 2A to 2D.

Further, a Jth (J is a positive integer) single-crystalline structure 60 substantially the same as the second single-crystalline structure 40 in FIGS. 2A to 2D, an Rth (R is a positive integer) semiconductor structure 62 similar to the first semiconductor structure 22 in FIGS. 2A to 2D, a Pth (P is a positive integer) insulation layer 64 substantially the same as the first insulation layer 24 in FIGS. 2A to 2D, an Mth (M is a positive integer) seed layer 68 substantially the same as the first seed layer 28 in FIGS. 2A to 2D, and a (J+1)th single-crystalline structure 70 may be repeatedly formed on the third single-crystalline structure 50. In an example embodiment of the present invention, a plurality of the single-crystalline structures may be repeatedly formed to manufacture a highly integrated semiconductor device.

According to some example embodiments of the present invention, the single-crystalline thin film including dense and large-size grains may be formed by a simple process, and the single-crystalline thin film may be easily formed in a region in which a seed layer may not be easily formed, such as a peripheral region. Furthermore, the single-crystalline thin film of the present invention may have fewer grain boundaries.

Therefore, the method of forming the single-crystalline thin film in accordance with the present invention may be advantageously employed in a method of forming a channel layer having a stacked structure to improve the reliability of a highly integrated semiconductor device.

FIGS. 5A to 5D are cross-sectional views illustrating a method of manufacturing a NAND flash memory device in accordance with example embodiments of the present invention. FIGS. 6A to 6D are plan views illustrating the method of manufacturing the NAND flash memory device shown in FIGS. 5A to 5D, respectively.

Figure 5A:
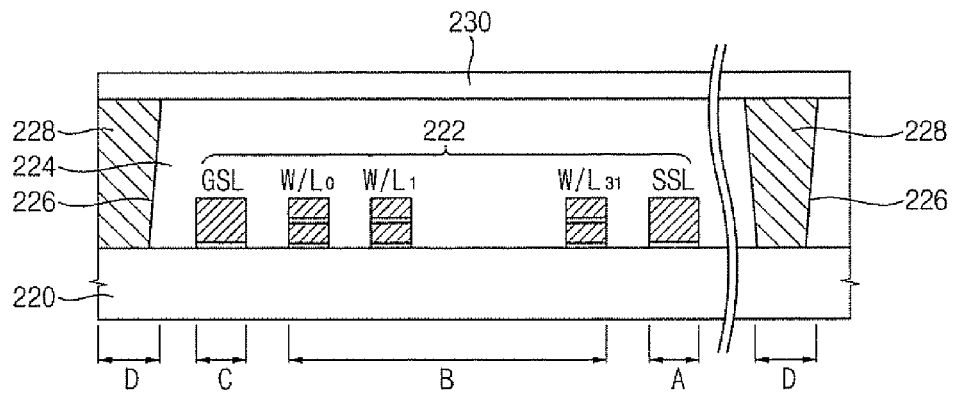
FIGS. 5A to 5D are cross-sectional views illustrating a method of manufacturing a NAND flash memory device in accordance with example embodiments of the present invention.
Figure 6A:
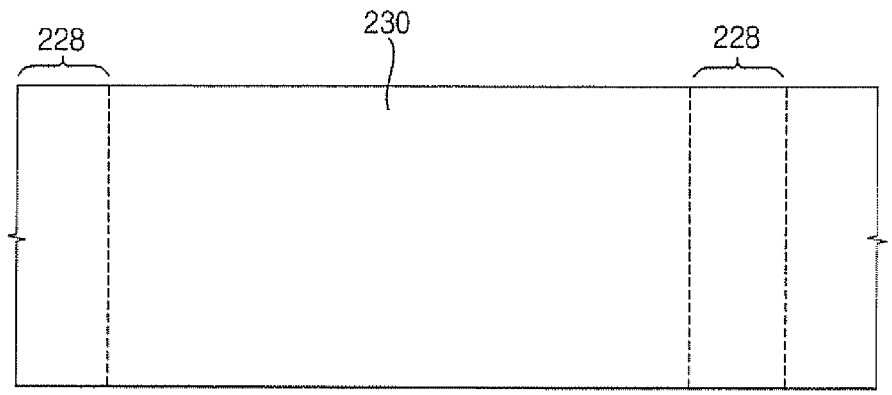
FIGS. 6A to 6D are plan views illustrating the method of manufacturing the NAND flash memory device shown in FIGS. 5A to 5D, respectively.

Referring to FIGS. 5A and 6A, a single-crystalline substrate 220 including a single-crystalline material is provided. The single-crystalline material may include single-crystalline silicon, single-crystalline germanium, etc. In one example embodiment of the present invention, the single-crystalline substrate 220 may include a silicon substrate, an SOI substrate, a germanium substrate, a silicon-germanium substrate, etc. In another example embodiment of the present invention, the single-crystalline substrate 220 may include a single-crystalline thin film formed from an amorphous thin film through a phase transition process. The single-crystalline substrate 220 may include the silicon substrate. Further, the single-crystalline substrate 220 may include a string selection transistor region A, a memory cell region B, a ground selection transistor region C and a common source line region D.

A string structure 222 including a selection transistor and a memory cell is formed on the single-crystalline substrate 220. The string structure 222 may correspond to a unit string included in a NAND flash memory device. The selection transistor may include a string selection transistor SSL and a ground selection transistor GSL. For example, the string structure 222 may include a bit line contact (not shown), the string selection transistor SSL, a plurality of memory cells $W/L_{0-31}$, the ground selection transistor GSL, a common source line (not shown), etc. The selection transistor may have a stacked structure including a gate oxide layer and a gate electrode. Each of the memory cells may a stacked structure including a tunnel oxide layer, a floating gate, a dielectric layer and a control gate. The string structure 222 may further include various elements in accordance with a type of the NAND flash memory device.

An insulation layer (not shown) is formed on the single-crystalline substrate 220 to cover the string structure 222. The insulation layer may be formed using an oxide such as silicon oxide. For example, the insulation layer may be formed using USG, SOG, HDP-CVD oxide, FOx, TEOS, PE-TEOS, PSG, BPSG, etc.

The insulation layer is partially etched to thereby form an insulation layer pattern 224 including an opening 226 exposing the single-crystalline substrate 220. The opening 226 may expose a portion of the single-crystalline substrate 220 corresponding to the common source line region D. In one example embodiment of the present invention, the opening 226 may be formed using a photoresist pattern as an etching mask after the photoresist pattern is formed on the insulation layer. In another example embodiment of the present invention, the opening 226 may be formed by removing the common source line formed on the insulation layer.

In some example embodiments of the present invention, a plurality of openings may be formed. For example, one opening 226 may be formed relative to one unit string 222 of the NAND flash memory device.

Further, the openings may be spaced apart from each other by a distance of about 3 to about 5 μm. Particularly, the openings may be spaced apart from each other by the distance of about 3 to about 4.5 μm.

A seed layer 228 is formed on the single-crystalline substrate 220 in the opening 226. For example, one seed layer 228 may be formed relative to one unit string. The seed layer 228 may be formed by an SEG process. For example, the seed layer 228 may be formed by an LPE process, a VPE process, an MBE process, etc. The seed layer 28 may be formed by the VPE process.

In the SEG process, the seed layer 228 grows from a surface of the single-crystalline substrate 220 exposed through the opening 226 so that the seed layer 228 may have a crystalline structure substantially the same as that of the single-crystalline substrate 220. When the single-crystalline substrate 220 includes the silicon substrate, the seed layer 228 may include single-crystalline silicon. When the openings in the unit string are spaced apart from each other by a distance of about 3 to about 5 μm, a plurality of seed layers may be spaced apart from each other by a distance of about 3 to about 5 μm.

In an example embodiment of the present invention, the opening 226 may be filled with the first seed layer 228. In other words, the seed layer 228 may have a thickness substantially the same as that of the insulation layer pattern 224. When the seed layer 228 is positioned on the insulation layer pattern 224 around the opening 226, the seed layer 228 may be polished to remove a portion of the seed layer 228 formed on the insulation layer pattern 224 around the opening 226. The seed layer 228 may be partially removed by a CMP process.

After the seed layer 228 filling the opening 226 is formed, an amorphous thin film 230 is continuously formed on the insulation layer pattern 224 and the seed layer 228. The amorphous thin film 230 may include an amorphous material. When the single-crystalline substrate 220 includes the silicon substrate, the amorphous thin film 230 may include amorphous silicon. Alternatively, when the single-crystalline substrate 220 includes the germanium substrate, the amorphous thin film 230 may include amorphous germanium. Furthermore, when the single-crystalline substrate 220 includes the silicon-germanium substrate, the amorphous thin film 230 may include amorphous silicon-germanium.

The amorphous thin film 230 may be formed by a CVD process. The amorphous thin film 230 may have a relatively thin thickness. However, the thickness of the amorphous thin film 230 may vary as occasion demands.

Figure 5B:
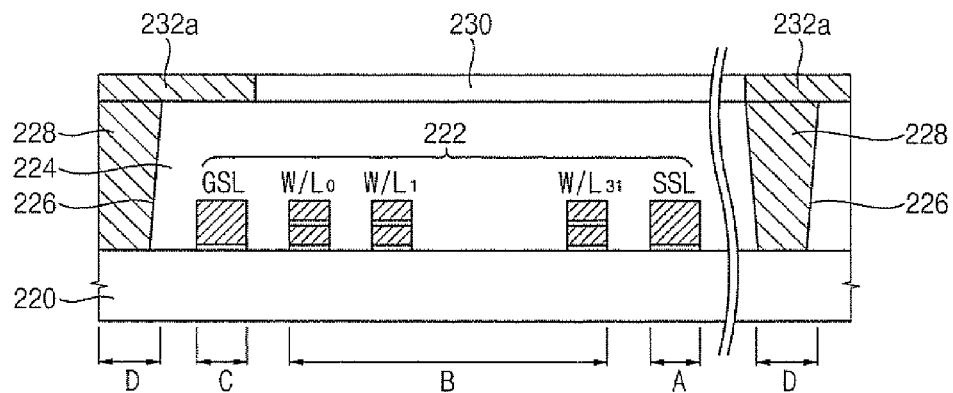
Figure 6B:
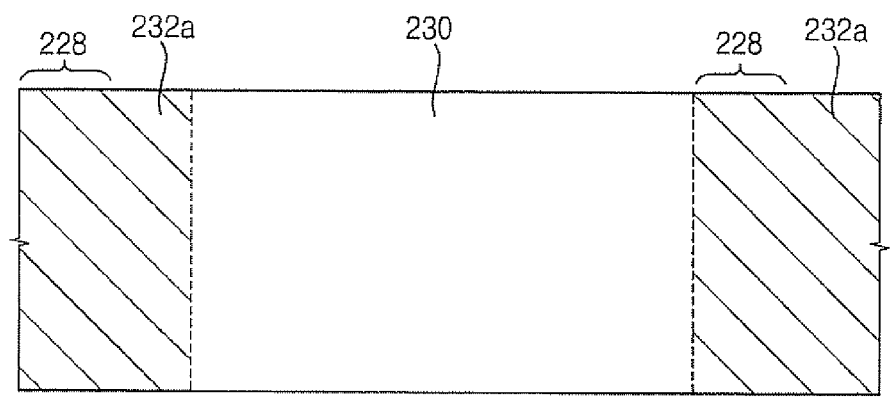

Referring to FIGS. 5B and 6B, a phase of a first region of the amorphous thin film 230 is changed. That is, the amorphous thin film 230 is partially phase-changed. The first region of the amorphous thin film 230 includes a portion of the amorphous thin film 230 overlapped (in direct contact with) with the seed layer 228. When the first region of the amorphous thin film 230 is phase-changed, the single-crystalline material in the seed layer 228 may serve as a seed. After the phase transition process of the amorphous thin film 230, the first region of the amorphous thin film 230 has a liquid phase changed from a solid phase. The phase of the first region of the amorphous thin film 230 may be changed by partially melting the amorphous thin film 230.

As appreciated by the present inventors, if the amorphous thin film 230 is partially melted by a thermal treatment process using a furnace, the string structure 222 may sustain serious damage because the thermal treatment process is performed at a high temperature. Additionally, the first region of the amorphous thin film 230 may not be easily melted using the furnace. Therefore, the first region of the amorphous thin film 230 may be melted by impinging or irradiating a laser beam (i.e., laser light) onto the first region of the amorphous thin film 230.

When the phase transition of the first region of the amorphous thin film 230 occurs in accordance with the irradiation of the laser beam, the first region of the amorphous thin film 230 may have a single-crystalline structure based on the single-crystalline material in the seed layer 228 serving as the seed. A transformation of the crystalline structure of the first region of the amorphous thin film 230 may proceed along a vertical direction and a horizontal direction. Since the phase transition and the crystalline structure transformation of the first region of the amorphous thin film 230 may occur for several nanoseconds, the first region of the amorphous thin film 230 may not flow from the seed layer 228 even though the phase of the first region of the amorphous thin film 230 is changed into the liquid phase from the solid phase.

The laser beam irradiated onto the first amorphous thin film 230 may have sufficient energy to melt the entire amorphous thin film 230 based on the thickness of the amorphous thin film 230 because the liquid phase is generated from a surface of the first region of the first amorphous thin film 230 to an interface between the first region of the amorphous thin film 230 and the seed layer 228. The energy of the laser beam may mainly vary in accordance with the thickness of the amorphous thin film 230. When the amorphous thin film 230 includes amorphous silicon, the laser beam may have energy capable of generating a temperature of above about 1,410° C. because the amorphous silicon may be melted at this temperature.

Meanwhile, the seed layer 228 may not be substantially affected by the irradiation of the laser beam because the seed layer 228 has an absorption coefficient different from that of the amorphous thin film 230 even though the phase of the first region of the amorphous thin film 230 is changed.

In an example embodiment of the present invention, the single-crystalline substrate 220 may be thermally treated when the phase of the first region of the amorphous thin film 230 is changed. In the thermal treatment process for the first region of the amorphous thin film 230, a temperature gradient in the first region of the amorphous thin film 230 may decrease so that larger single-crystalline grains may be formed at the irradiated portion of the amorphous thin film 230. When the single-crystalline substrate 220 is heated at a temperature of below about 200° C., the grains in the first region of the amorphous thin film 230 may have limited sizes. When the thermal treatment process is performed at a temperature of above about 600° C., a proper apparatus for heating the single-crystalline substrate 220 may not be equipped. Therefore, the single-crystalline substrate 220 may be heated at a temperature of about 200 to about 600° C. For example, the single-crystalline substrate 220 may be thermally treated at a temperature of about 350 to about 450° C.

As described above, the single-crystalline material in the seed layer 228 serve as the seeds in the phase transition of the first region of the amorphous thin film 230 so that the first region of the amorphous thin film 230 has the single-crystalline structure while the phase of the first region of the amorphous thin film 230 is changed. As a result, the first region of the amorphous thin film 230 is converted into a first single-crystalline thin film 232a. In an example embodiment of the present invention, the seed layer 228 includes single-crystalline silicon and the amorphous thin film 230 includes amorphous silicon so that the first single-crystalline thin film 232a includes single-crystalline silicon.

In an example embodiment of the present invention, since the phase transition of the first region of the amorphous thin film 230 may occur for several nanoseconds, the first single-crystalline layer 232a formed through the phase transition process may not have defects therein. Further, the grains in the first single-crystalline thin film 232a may be easily enlarged because the seed layer 228 including the single-crystalline material serves as the seed. That is, when the seed layer 228 serves as the seed and the phase of the first region of the amorphous thin film 230 is changed, the first single-crystalline thin film 232a may include dense and large grains.

Figure 5C:
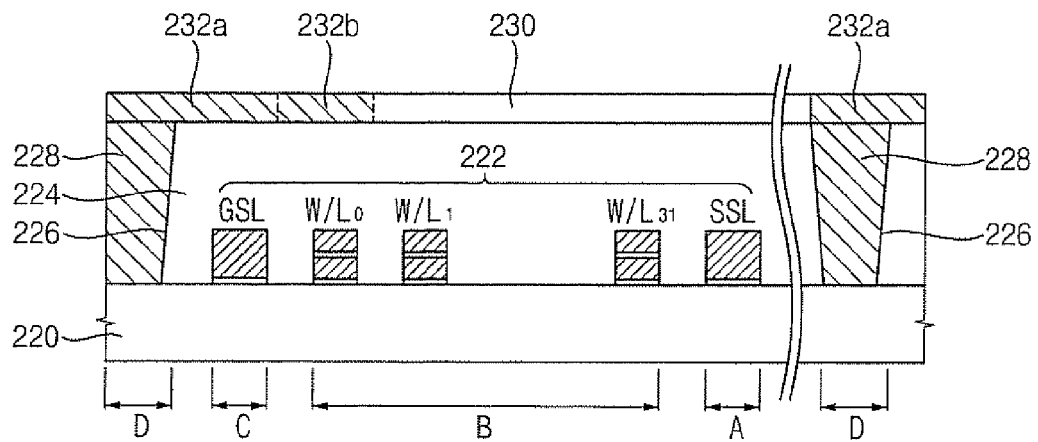
Figure 6C:
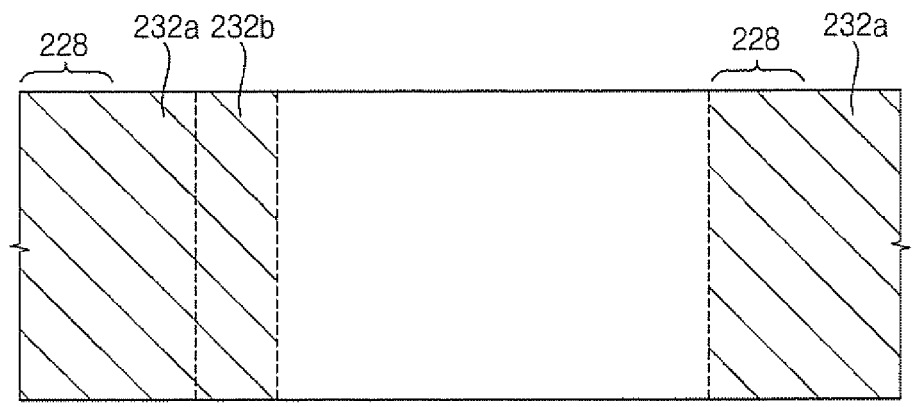

Referring to FIGS. 5C and 6C, a phase of a second region of the amorphous thin film 230 adjacent to the first single-crystalline thin film 232a is changed. The phase transition process for the second region of the amorphous thin film 230 may be substantially the same as the phase transition process for the first region of the amorphous thin film 230 described with reference to FIGS. 5B and 6B except that the first single-crystalline thin film 232a serves as a seed and the second region of the amorphous thin film 230 has an area substantially smaller than that of the first region of the amorphous thin film 230.

When the phase of the second region of the amorphous thin film 230 is changed to convert a crystalline structure of the second region of the amorphous thin film 230, the first single-crystalline thin film 232a serves as the seed so that the second region of the amorphous thin film 230 may have the area substantially smaller than that of the first region of the amorphous thin film 230.

In one example embodiment of the present invention, after a laser beam is irradiated from the first region of the amorphous thin film 230 to the second region of the amorphous thin film 230, the phase of the second region of the amorphous thin film 230 may be changed by irradiating the laser beam onto the second region of the amorphous thin film 230. In another embodiment of the present invention, the laser beam may be continuously irradiated from the first region to the second region of the amorphous thin film 230 to thereby continuously change the phases of the first and the second regions of the amorphous thin film 230. Thus, the first and the second regions of the amorphous thin film 230 may be partially overlapped each other rather than the first region is separated from the second region.

When the phase of the second region of the amorphous thin film 230 is changed, the first single-crystalline thin film 232a serves as the seed so that the second region of the amorphous thin film 230 has a single-crystalline structure. Therefore, the second region of the amorphous thin film 230 is changed into a second single-crystalline thin film 232b including a single-crystalline material. In an example embodiment of the present invention, since the first single-crystalline thin film 232a includes single-crystalline silicon, the second single-crystalline thin film 232b may also include single-crystalline silicon.

Figure 5D:
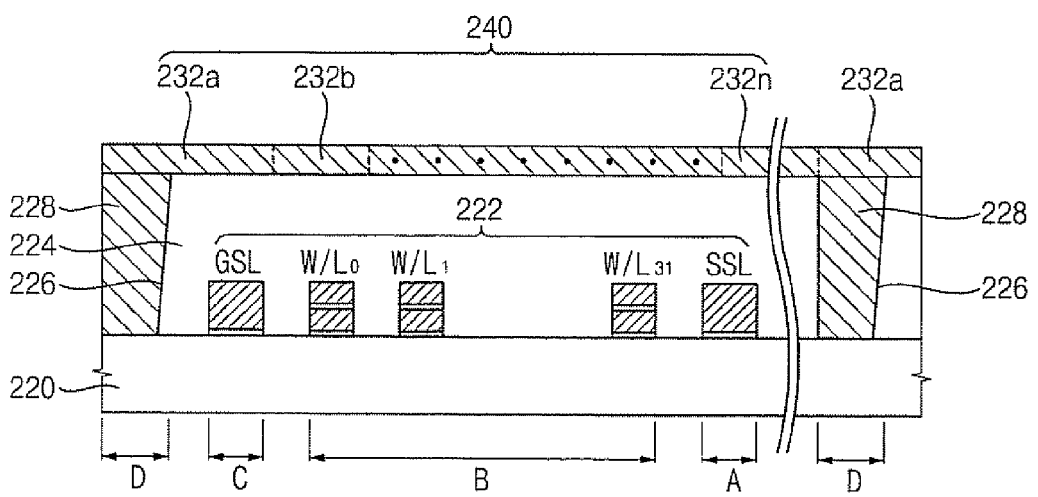
Figure 6D:
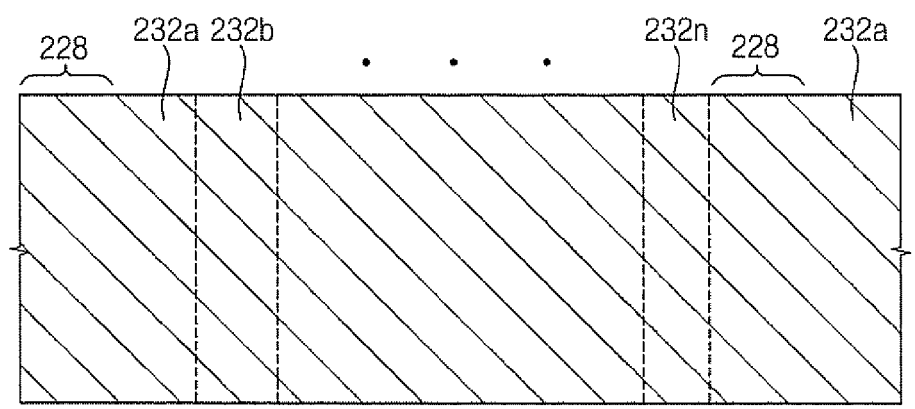

Referring to FIGS. 5D and 6D, a phase of third region of the amorphous thin film 230 adjacent to the second single-crystalline thin film 232b to a phase of an Nth (N is a positive integer) region of the amorphous thin film 230 adjacent to an (N−1)th region of the amorphous thin film 230 are sequentially changed.

The third region of the amorphous thin film 230 may have an area substantially smaller than that of the second region of the amorphous thin film 230, and the Nth region of the amorphous thin film 230 may have an area substantially smaller than that of the (N−1)th region of the amorphous thin film 230 because the single-crystalline thin films previously formed serve as seeds as described above. Further, a laser beam may be continuously irradiated onto all of the regions of the amorphous thin film 230 when the phases of all the regions of the first amorphous thin film 230 are changed. Although an irradiation speed of the laser beam from the first region to the Nth region of the amorphous thin film 230 may vary, the laser beam may be irradiated from the first to the Nth regions of the amorphous thin film 230 for sufficient times so as to sufficiently melt each of the first to the Nth regions of the amorphous thin film 230.

When the phase of the third region of the amorphous thin film 230 is changed, the second single-crystalline thin film 32b serves as the seed so that the third region of the amorphous thin film 230 may have the single-crystalline structure. Thus, the third region of the amorphous thin film 230 may be converted into a third single-crystalline thin film (not shown). Similarly, when the phase of the Nth region of the amorphous thin film 30 is changed, an (N−1)th single-crystalline thin film formed from the Nth region serves as a seed so that the Nth region of the amorphous thin film 230 may also have a single-crystalline structure. As a result, the Nth region of the amorphous thin film 230 may be converted into an Nth single-crystalline thin film 232n.

In an example embodiment of the present invention, the phases of the regions of the amorphous thin film 230 formed on the seed layer 228 and the insulation layer pattern 224 may be continuously changed, and the crystalline structures of the regions of the amorphous thin film 230 may be converted into the single-crystalline structures using the single-crystalline thin films previously formed as the seeds so that a single-crystalline channel layer 240 including the first single-crystalline thin film 232a to the Nth single-crystalline thin film 232n may be formed on the insulation layer pattern 224 and the seed layer 228. In some embodiments of the present invention, the single-crystalline channel layer of the NAND flash memory device including one string structure and another string structure adjacent to each other by a distance of about 3 to about 5 μm may be easily manufactured.

Although not shown, after removing the seed layer 228 filling the opening 226, a conductive material may fill the opening 226 to form a common source line filling the opening 226. Therefore, the method of forming the channel layer 240 in accordance with some example embodiments of the present invention may be employed in a process of forming a channel layer for the NAND flash memory device.

Figure 7A:
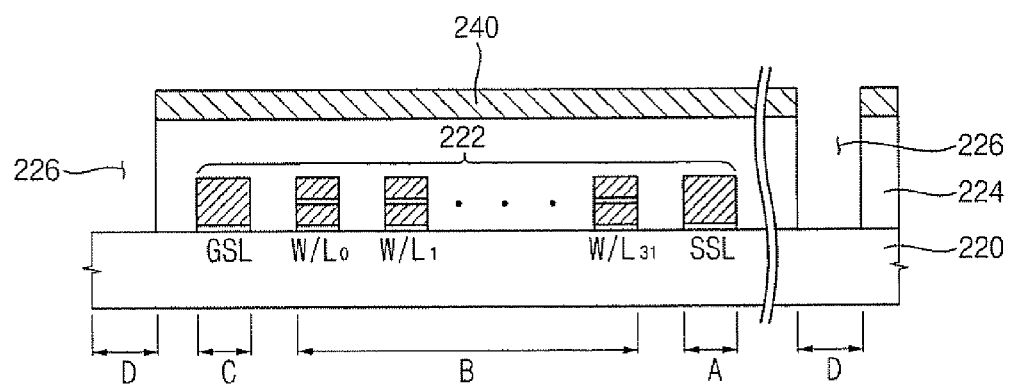
FIGS. 7A to 7C are cross-sectional views illustrating a method of manufacturing a NAND flash memory device in accordance with example embodiments of the present invention.
Figure 7B:
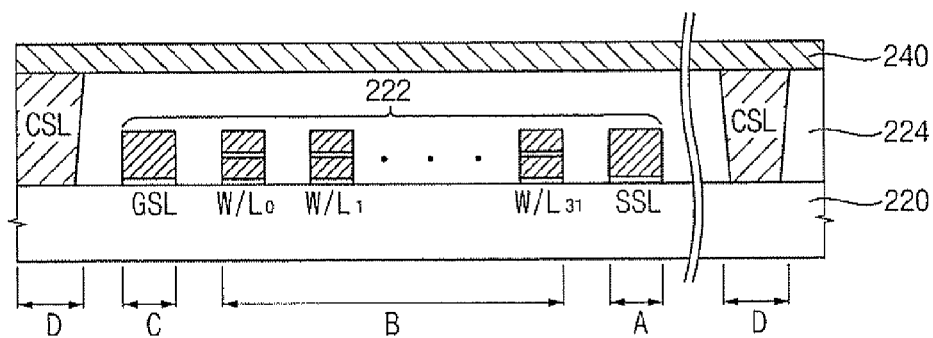
Figure 7C:
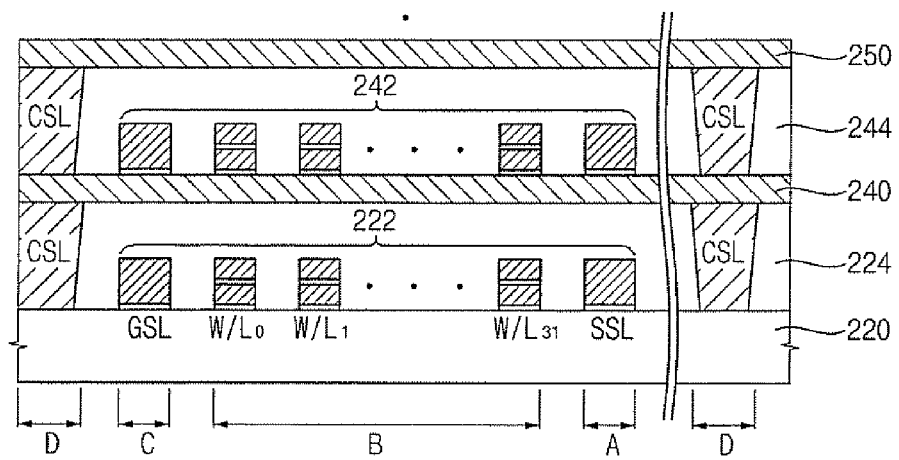

FIGS. 7A to 7C are cross-sectional views illustrating a method of manufacturing a NAND flash memory device in accordance with example embodiments of the present invention. The same reference numerals will be used to refer to the same elements having a similar structure and/or function in FIGS. 5A to 5D.

Referring to FIG. 7A, a single-crystalline substrate 220 including a first string structure is provided. The first string structure may include a selection transistor and memory cells. The selection transistor may include a string selection transistor and a ground selection transistor. The single-crystalline substrate 220 may include the silicon substrate. Further, the single-crystalline substrate 220 may include a string selection transistor region A, a memory cell region B, a ground selection transistor region C and a common source line region D.

A first channel layer 240 is formed on the single-crystalline substrate 220 by processes substantially identical to those of forming the channel layer 240 described with reference to FIGS. 5A to 5D. The first channel layer 240 includes a first single-crystalline thin film 232a to an Nth single-crystalline thin film 232n described with reference to FIGS. 5A to 5D.

After forming an etch mask (not shown) on the first channel layer 240, a portion of the first channel layer 240 exposed by the etch mask is etched to expose a portion of a seed layer (not shown). The exposed portion of the seed layer is removed from the single-crystalline substrate 220 to form a first opening exposing a portion of the single-crystalline substrate 220. For example, the exposed portion of the seed layer may be removed by a wet etching process. In the wet etching process, the common source line region D of the single-crystalline substrate 220 may be exposed.

Referring to FIG. 7B, a common source line CSL is formed in the first opening 226. For example, the first opening 226 may be partially filled with a conductive material to form the common source line CSL in the first opening 226. The common source line CSL may have a thickness substantially thinner than that of a first insulation layer pattern 224. For example, the conductive material may include polysilicon, tungsten, aluminum, etc.

An amorphous layer (not shown) is formed on the common source line CSL in the first opening 226. The amorphous layer may be transformed into a single-crystalline layer (not shown). In some embodiments of the present invention, an insulation interlayer (not shown) may be further formed between the common source line CSL and the single-crystalline layer.

Referring to FIG. 7C, a second string structure 242 is formed on the first channel layer 240. The second string structure 242 may have various elements in accordance with a type of the NAND flash memory device, in similar way to the first string structure 222 described with reference to FIGS. 5A to 5D. For example, the second string structure 242 may include a string selection transistor SSL, a plurality of memory cells $W/L_{0-31}$, a ground selection transistor GSL, etc.

A second insulation layer pattern 244, a second opening 246 and a second seed layer (not shown) are formed on the first channel layer 240 including the second string structure 242 by processes substantially the same as those of forming the first insulation layer pattern 224, the first opening 226 and the first seed layer described with reference to FIGS. 5A to 5D.

A second channel layer 250 is formed on the second insulation layer pattern 244 and a common source line CSL is formed in the second opening 246 by processes substantially the same as those of forming the first channel layer 240 and the common source line CSL described with reference to FIGS. 5A to 5D.

A Jth (J is an integer greater than 3) channel layer 260 substantially the same as the first channel layer 240 in FIGS. 5A to 5D, an Rth (R is an integer than 3) string structure 262 similar to the first string structure 222 in FIGS. 5A to 5D, a Pth (P is an integer greater than 3) insulation layer pattern 264 substantially the same as the first insulation layer pattern 224 in FIGS. 5A to 5D, an Mth (M is an integer greater than 3) seed layer (not shown) substantially the same as the first seed layer in FIGS. 5A to 5D, and a (J+1)th channel layer 270 may be repeatedly formed on the second channel layer 250. In an example embodiment of the present invention, a plurality of the channel layers may be repeatedly formed to manufacture a highly integrated NAND flash memory device.

The following Example shall be regarded as merely illustrative and shall not be construed as limiting the invention. Using processes described with reference to FIGS. 7A to 7C, an insulation layer pattern including three bar-shaped openings was formed on a single-crystalline silicon substrate. Single-crystalline seed layers were formed in the openings, respectively. The single-crystalline seed layers were spaced apart from one another by a distance of less than about 4 μm.

After an amorphous silicon thin film having a uniform thickness was formed on the insulation layer pattern having the single-crystalline seed layers, a laser beam was irradiated onto the amorphous silicon thin film to transform the amorphous silicon thin film into a channel layer by a phase transition process.

Figure 8:
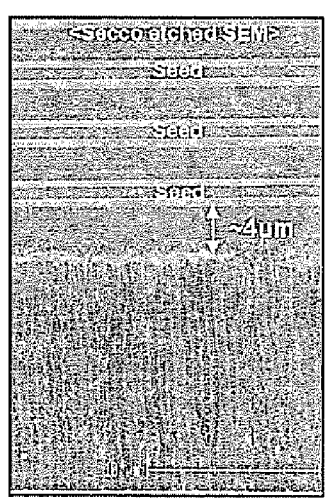
FIG. 8 is a scanning electron microscope (SEM) photograph showing a crystal structure of a channel layer according to distances between the seed layers.

FIG. 8 is a scanning electron microscope (SEM) photograph showing a crystal structure of a channel layer according to distances between the seed layers.

FIG. 8 shows that the silicon channel layer had a uniform single-crystalline structure when the phase-transition process was performed using the laser beam and the seed layers were spaced apart from each other by a distance of less than about 4 μm. The silicon channel layer was formed by a phase transition process using a third seed layer as a seed. One portion of the silicon channel layer that reached to a distance of about 4 μm spaced apart from the third seed layer had a uniform single-crystalline structure, whereas the other portion of the silicon channel layer spaced apart from the third seed layer by a distance of over about 4 μm had a polycrystalline structure. That is, in order to manufacture a channel layer for a NAND flash memory device, a phase transition process may be performed on the condition that the seed layers, one of which is formed relative to one unit string, are spaced apart from one another by less than about 4 μm.

FIGS. 9A to 9D are cross-sectional views illustrating a method of manufacturing a semiconductor memory device in accordance with example embodiments of the present invention.

Figure 9A:
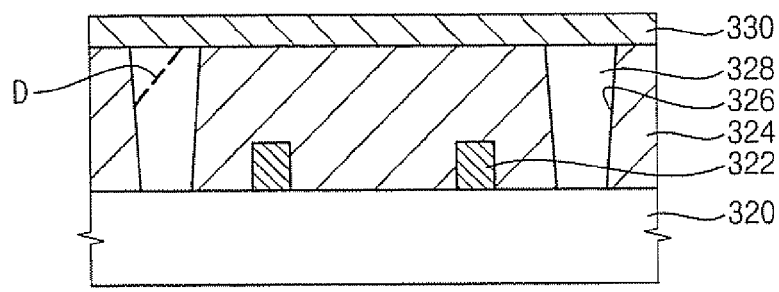
FIGS. 9A to 9D are cross-sectional views illustrating a method of manufacturing a semiconductor memory device in accordance with example embodiments of the present invention.

Referring to FIG. 9A, a single-crystalline substrate 320 including a single-crystalline material is provided. The single-crystalline material may include single-crystalline silicon, single-crystalline germanium, etc. The single-crystalline substrate 320 may include a single-crystalline silicon substrate.

A cell structure 322 is formed on the single-crystalline substrate 320. For example, the cell structure 322 may include a dynamic random access memory (DRAM) device having a transistor and a capacitor, a phase-changeable random access memory (PRAM) device having a switching element and a phase-changeable structure, a NAND flash memory device having a selection transistor and memory cells, etc. Further, the cell structure 655 includes a transistor, a capacitor, a phase-changeable structure, a string structure. In some embodiments of the present invention, either the transistor or the selection may have a stacked structure including a gate insulation layer and a gate electrode. Each of the memory cells may have a stacked structure including a tunnel insulation layer, a floating gate, a dielectric layer and a control gate.

A first insulation layer (not shown) is formed on the single-crystalline substrate 320 to cover the cell structure 322. The first insulation layer is partially etched to thereby form a first insulation layer pattern 324 including a first opening 326 exposing the single-crystalline substrate 320. The first insulation layer pattern 324 including first opening 326 may have a bar shape. In one example embodiment of the present invention, the first opening 326 may be formed using a photoresist pattern as an etching mask after the photoresist pattern is formed on the first insulation layer.

A seed layer 328 is formed on the single-crystalline substrate 320 in the first opening 326. The seed layer 328 may be formed by an SEG process.

In the SEG process, the seed layer 328 grows from a surface of the single-crystalline substrate 320 exposed through the first opening 326 so that the seed layer 328 may have a crystalline structure substantially the same as that of the single-crystalline substrate 320. When the single-crystalline substrate 320 includes the silicon substrate, the seed layer 328 may include single-crystalline silicon.

In an example embodiment of the present invention, the first opening 326 may be filled with the seed layer 328. In other words, the seed layer 328 may have a thickness substantially the same as that of the first insulation layer pattern 324. When the seed layer 328 is positioned on the first insulation layer pattern 324 around the first opening 326, the seed layer 328 may be polished to remove a portion of the seed layer 328 formed on the first insulation layer pattern 324 around the opening 326. The seed layer 328 may be partially removed by a CMP process When the seed layer is formed on the single-crystalline substrate 320 by a selective epitaxial growth process, an upper portion of the seed layer 328 may include defects (not shown) that may have an orientation in the crystallographic (111) direction due to a thermal budget or a sidewall of the first insulation layer pattern 328. In a subsequent process, the defects may be transcribed with an orientation of about 54.7° in a crystallographic view of the cubic structure. Thus, when a crystallized layer is to be formed on the seed layer using the seed layer as a seed, the crystallized layer may include the defects.

After the seed layer 328 filling up the first opening 326 is formed, a first amorphous thin film 330 is formed on the first insulation layer pattern 324 and the seed layer 328. The first amorphous thin film 330 may include an amorphous material. When the single-crystalline substrate 320 includes the silicon substrate, the first amorphous thin film 330 may include amorphous silicon.

The first amorphous thin film 330 may be formed by a CVD process. The first amorphous thin film 330 may have a relatively thin thickness; however, the thickness of the first amorphous thin film 330 may vary as occasion demands.

Figure 9B:
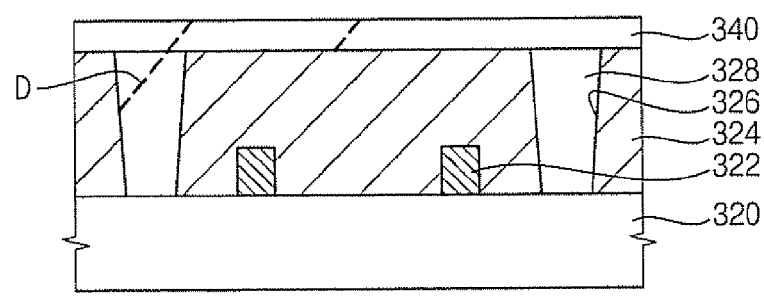

Referring to FIG. 9B, a first channel layer 340 is formed on the first insulation layer pattern 324 and the seed layer 328 by a phase transition of the first amorphous thin film 330 and a transformation of a crystal structure of the first amorphous thin film 330. For example, a laser beam may be irradiated onto the first amorphous thin film to melt the first amorphous thin film 330 in a phase transition process of the first amorphous thin film 330.

When the phase transition of the first amorphous thin film 330 occurs in accordance with the irradiation of the laser beam, the crystal structure of the first amorphous thin film 330 may be transformed to have a single-crystalline structure based on the single-crystalline material in the seed layer 328 serving as the seed. A transformation of the crystalline structure of the first region of the amorphous thin film 330 may proceed along a vertical direction and a horizontal direction. Since the phase transition and the crystalline structure transformation of the first region of the first amorphous thin film 330 may occur for several nanoseconds, the first amorphous thin film 330 may not flow from the seed layer 328 even though the phase of the first amorphous thin film 330 is changed into the liquid phase from the solid phase.

The laser beam irradiated onto the first amorphous thin film 330 may have sufficient energy to melt the entire amorphous thin film 330 based on the thickness of the first amorphous thin film 330 because the liquid phase is generated from a surface of the first region of the first amorphous thin film 330 to an interface between the first region of the first amorphous thin film 330 and the seed layer 328. The energy of the laser beam may mainly vary in accordance with the thickness of the first amorphous thin film 330.

In an example embodiment of the present invention, the single-crystalline substrate 320 may be thermally treated when the phase of the first amorphous thin film 330 is changed. In the thermal treatment process for the first amorphous thin film 330, a temperature gradient in the first amorphous thin film 330 may decrease so that larger single-crystalline grains may be formed at the irradiated portion of the first amorphous thin film 330

As described above, the single-crystalline materials in the seed layer 328 serve as the seeds in the phase transition of the first amorphous thin film 330 so that the first amorphous thin film 330 has the single-crystalline structure after the phase of the first amorphous thin film 330 is changed. As a result, the first amorphous thin film 330 is converted into a first channel layer 340 having a single-crystalline structure.

When the seed layer 328 serving as the seed for forming the first channel layer 340 has the defects, defects may occur at an upper portion of the first channel layer 340. The defects may have an orientation in the crystallographic (111) direction due to a relatively thin thickness of the first channel layer 340. That is, the defects of the seed layer may be transcribed with an orientation of about 54.7° in a crystallographic view during a transformation process against the first amorphous thin layer 330. Thus, when the first channel layer 340 is formed on the seed layer 328 using the single-crystalline material in the seed layer 328 as the seed, the defects may occur at the upper portion of the first channel layer 340 having a relatively thin thickness.

Figure 9C:
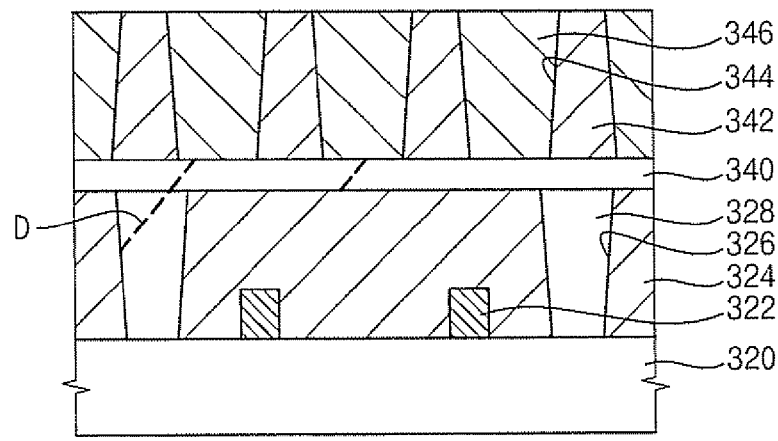

Referring to FIG. 9C, a second insulation layer (not shown) is formed on the first channel layer 340 having the defects therein. The second insulation layer may be formed using an oxide such as silicon oxide. For example, the second insulation layer may be formed using USG, SOG, HDP-CVD oxide, FOx, TEOS, PE-TEOS, PSG, BPSG, etc.

The second insulation layer is partially etched to form a second insulation layer pattern 342 having a second opening 344 exposing a portion of the first channel layer 340. In one example embodiment of the present invention, the second opening 344 may be formed using a photoresist pattern as an etching mask after the photoresist pattern is formed on the second insulation layer. The second opening 344 may have an aspect ratio, which is a ratio between a width of the second opening 344 and a height of the second opening 344, of more than about 1:2. For example, the aspect ratio of the second opening 344 may be about 1:2 to about 1:5. Thus, the defects in the first channel layer 340 may be not transcribed up to an upper portion of the second channel layer 340, which is to be formed in the second opening 344 in a subsequent process.

A second amorphous thin film 346 is formed in the second opening 344. When the first channel layer 340 includes single-crystalline silicon, the second amorphous thin film 346 may include amorphous silicon.

The second amorphous thin film 346 may be formed by a CVD process. The second amorphous thin film 346 may have a sufficient thickness enough to fill the second opening 344; however, the thickness of the second amorphous thin film 345 may vary as occasion demands.

In one example embodiment of the present invention, the second amorphous thin film 346 may have a thickness substantially the same as that of the second insulation layer pattern 342. When the second amorphous thin film 346 is positioned on the second insulation layer pattern 342 around the second opening 344, the second amorphous thin film 346 may be polished to remove a portion of the second amorphous thin film 346 formed on the second insulation layer pattern 342 around the second opening 344. The second amorphous thin film 346 may be partially removed by a CMP process.

In another example embodiment of the present invention, the second amorphous thin film 346 may be formed in the opening 344 and on the second insulation layer pattern 342 around the second opening 344. When a portion of the second amorphous thin film 346 positioned on the second insulation layer pattern 342 has an uneven top surface, the second amorphous thin film 346 may be further planarized.

Figure 9D:
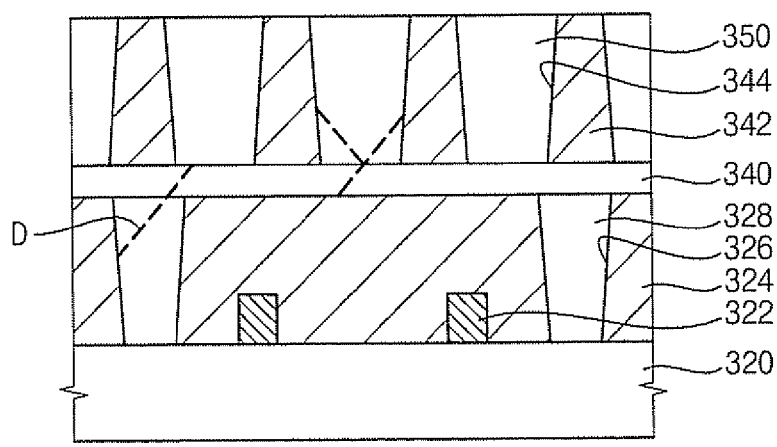

Referring to FIG. 9D, a phase of the second amorphous thin film 346 is changed. That is, the second amorphous thin film 346 is epitaxially phase-changed. The second amorphous thin film 346 is transformed into a second channel layer 350 including defects at the lower portion thereof. For example, a crystal structure of the second amorphous thin film 346 may be transformed into a single-crystalline structure using the first channel layer 340 as a seed during a phase transition of the second amorphous thin film 346.

When the laser beam is irradiated onto the second amorphous thin film 346 to change the phase of the second amorphous thin film 346, a crystal structure of the second amorphous thin film 346 is transformed into the single-crystalline structure using the single-crystalline material in the first channel layer 340 as the seed. A transformation of the crystalline structure of the second amorphous thin film 346 may proceed along a vertical direction and a horizontal direction.

When the first channel layer 340 has the defects therein, the defects may be transcribed into a lower portion of the second channel layer 350 at a direction of about 54.7° in a crystallographic view. When the defects in the first channel layer 340 are transcribed into the second channel layer 350, the defects may occur at a lower portion of the second channel layer 350, whereas the defects may not occur at an upper portion of the second channel layer 350, while taking into consideration that the defects are transcribed at the direction of about 54.7° in a crystallographic view and the second channel layer 350 has a relatively thick thickness. Since the upper portion of the second channel layer 350 does not include the defects, the second channel layer 350 may serve as an active region for a memory cell structure.

Figure 10A:
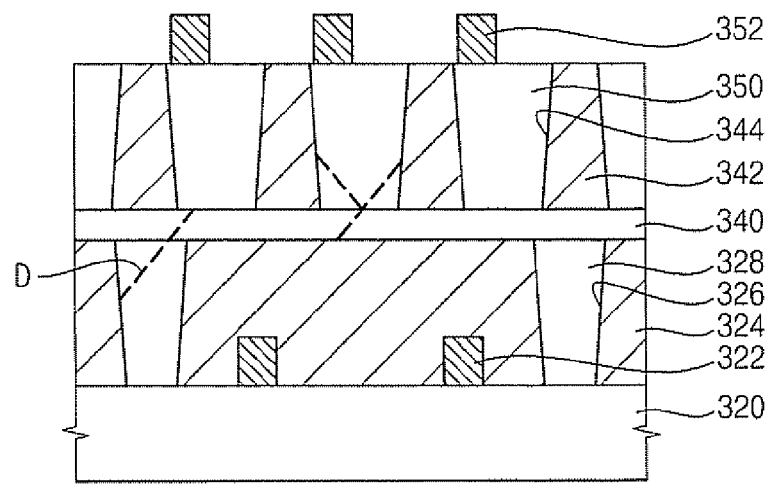
FIGS. 10A and 10B are cross-sectional views illustrating a method of manufacturing a semiconductor memory device in accordance with example embodiments of the present invention.
Figure 10B:
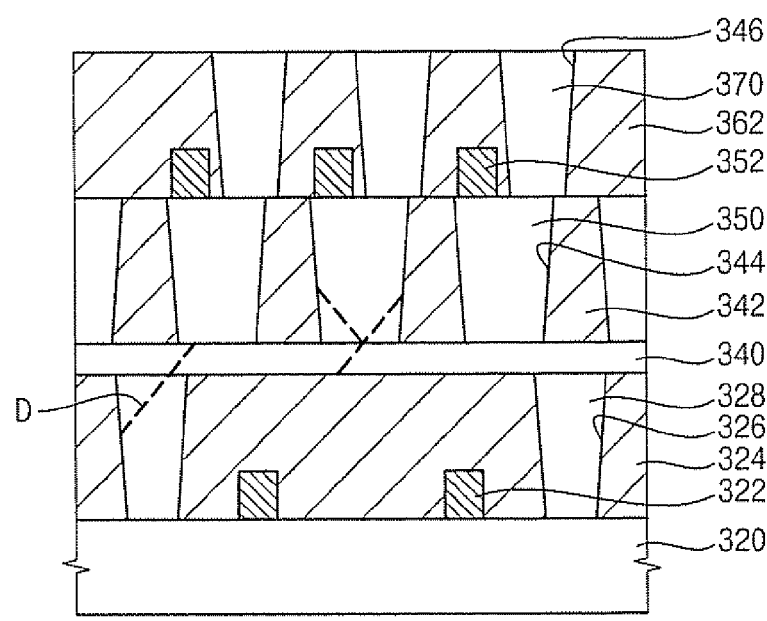

FIGS. 10A and 10B are cross-sectional views illustrating a method of manufacturing a semiconductor memory device in accordance with example embodiments of the present invention Referring to FIG. 10A, after providing a single-crystalline substrate 320, a first memory cell structure 322 is formed on the single-crystalline substrate 320. For example, the first memory cell structure 322 may include a transistor and a capacitor, a phase-changeable structure, string structure, etc.

A first insulation layer pattern 324 is formed on the single-crystalline substrate 320 by processes substantially the same as those described with reference to FIGS. 9A to 9D. The first insulation layer pattern 324 has a first opening 326 exposing the single-crystalline substrate 320.

The seed layer 328 is formed in the first opening 326 using a single-crystalline material. The seed layer 328 may include defects D therein. The first amorphous thin film (not shown) is formed on the first insulation layer pattern 324 and the seed layer 328. The first amorphous thin film may have an amorphous material. A phase of the first amorphous thin film is changed and a crystal structure of the first amorphous thin film is transformed into a single-crystalline structure to form a first channel layer 340 having the single-crystalline structure on the first insulation layer pattern 324 and the seed layer 328. The defects D in the seed layer 328 may be directionally transcribed so that the first channel layer 340 may include defects being oriented in the crystallographic (111) direction.

A second insulation layer pattern 342 is formed on the first channel layer 340 by processes substantially the same as those described with reference to FIGS. 9A to 9D. The second insulation layer pattern 342 has a second opening 344 exposing the first channel layer 340. The second insulation layer pattern 342 may serve as an isolation layer pattern for a semiconductor memory device.

After a second amorphous thin film (not shown) is formed in the second opening 344, the second amorphous thin film is crystallized to form a second channel layer 350 in the second opening 344 by processes substantially the same as those described with reference to FIGS. 9A to 9D. When the first channel layer 340 including the defects serves as a seed during a phase-transition process of the second amorphous thin film, the second channel layer 350 may include a lower portion having defects and an upper portion free from defects. When the first channel layer 340 has the defects therein, the defects may be transcribed into a lower portion of the second channel layer 350 at a direction of about 54.7° in a crystallographic view. Thus, when the defects in the first channel layer 340 are transcribed into the second channel layer 340 having a relatively thick thickness, the defects may occur at a lower portion of the second channel layer 340, whereas the defects may not occur at an upper portion of the second channel layer 340, while taking into consideration that the defects are transcribed at the direction of about 54.7° in a crystallographic view. Since the upper portion of the second channel layer 350 does not include the defects, the second channel layer 350 may serve as an active region for a second memory cell structure 352, which is to be formed in a subsequent process.

The second memory cell structure 352 is formed on the second channel layer 350. The second memory cell structure 352 may include various elements in accordance with a type of a DRAM or a NAND flash memory device, in similar way to the first memory cell structure 322.

Referring to FIG. 10B, a third insulation layer pattern 362 is formed on the second channel layer 350 to cover the second memory cell structure 352. The third insulation layer pattern 362 includes a third opening 364 exposing the second channel layer 350. A third amorphous thin film (not shown) is formed in the third opening 364. The third amorphous thin film is transformed to form the third channel layer 370 in the third opening 364 by processes the same as those for forming the second channel layer 350 described with reference to FIG. 10A. A third memory cell structure (not shown) may be further formed on the third channel layer 370.

Fourth to Pth (P is an integer greater than 5) insulation layer patterns substantially the same as the third insulation layer pattern 362, fourth to Jth (J is an integer greater than 5) channel layers substantially the same as the third channel layer 370, and fourth to Kth (K is an integer greater than 5) memory cell structure substantially the same as the third memory cell structure may be repeatedly formed on the third channel layer 370. Thus, an above described method may be employed to realize a highly integrated semiconductor device.

According to the embodiments of the present invention, a single-crystalline thin film including dense and large grains, which may serve as a channel layer for a NAND flash memory device, may be formed by a simple process using one seed formed relative to one unit string. Further, since seeds are spaced apart from each other by a distance of about 3 to 5 μm, a generation of a grain boundary in the single-crystalline thin film may be suppressed and a channel layer having a uniform single crystal structure may be achieved. Thus, a method of manufacturing a semiconductor in accordance of the present invention may be employed to form a channel layer for the NAND flash memory device to improve the reliability of the semiconductor device, which is required to have a high degree of integration.

Meanwhile, when a first channel layer for forming a memory cell has defects, the first channel layer may not be utilized. Instead of the first channel layer, a second channel layer free from defects may be formed on the first channel layer by a laser epitaxial growth process. A phase of an amorphous thin film filling an opening of an insulation layer pattern is changed by the laser epitaxial growth process to form the second channel layer so that the defects may not be transcribed up to an upper portion of the second channel layer due to a transcription angle of the defects included in the first channel layer. Thus, the second channel layer free from the defects may be employed as an active region for a semiconductor memory device having a stacked structure.

Thus, a method of manufacturing a semiconductor in accordance of the present invention may be employed to form a channel layer for the semiconductor memory device having a stacked structure to improve the reliability of the semiconductor device, which is required to have a high degree of integration.

Therefore, the method of forming the single-crystalline thin film in accordance with the present invention may be advantageously employed in a method of forming a channel layer having a stacked structure to improve the reliability of a highly integrated semiconductor device.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a semiconductor device, comprising:

forming a string structure including a selection transistor and a memory cell on a substrate;

forming an insulation layer pattern on the substrate to cover the string structure, the insulation layer pattern including at least one opening exposing a portion of the substrate adjacent to the selection transistor;

forming a seed layer including a single-crystalline material in the opening;

forming an amorphous thin film including an amorphous material on the insulation layer pattern and the seed layer; and transforming the amorphous thin film into a single-crystalline thin film, using the single-crystalline material in the seed layer as a seed during a phase transition of the amorphous thin film, to provide a channel layer on the insulation layer pattern and the seed layer, wherein transforming comprises:

changing a phase of a first region of the amorphous thin film, the first region of the amorphous thin film being overlapped with the seed layer;

transforming the first region of the amorphous thin film into a first single-crystalline thin film including the single-crystalline material, by converting a crystalline structure of the first region of the amorphous thin film into a single-crystalline structure, using the single-crystalline material in the seed layer as the seed during a phase transition of the first region of the amorphous thin film;

changing a phase of a second region of the amorphous thin film, the second region of the amorphous thin film being laterally adjacent to the first single-crystalline thin film; and transforming the second region of the amorphous thin film into a second single-crystalline thin film including the single-crystalline material, by converting a crystalline structure of the second region of the amorphous thin film into a single-crystalline structure, using the single-crystalline material in the first single-crystalline thin film as the seed during a phase transition of the second region of the amorphous thin film, and wherein the first region of the amorphous thin film has an area substantially larger than that of the second region of the amorphous thin film.

2. The method of claim 1, wherein the substrate includes a single-crystalline structure and the substrate includes a silicon substrate, a silicon-on-insulator (SOI) substrate, a germanium substrate, or a silicon-germanium substrate.

3. The method of claim 1, wherein the substrate comprises a single-crystalline substrate material, wherein forming the seed layer comprises: filling the opening with an amorphous material; and transforming a crystal structure of the amorphous material into a single-crystalline structure using the substrate as a seed.

4. The method of claim 3, wherein immediately adjacent ones of a plurality of openings are spaced apart from each other by a distance of about 3 to about 5 μm.

5. The method of claim 1, wherein one opening is formed for a respective single unit string.

6. The method of claim 1, wherein the seed layer is formed from the substrate exposed through the opening by a selective epitaxial growth process.

7. The method of claim 1, wherein changing the phases of the first and second regions of the amorphous thin film comprises melting the amorphous thin film by irradiating a laser beam onto the amorphous thin film.

8. The method of claim 1, wherein transforming further comprises:

changing a phase of an Nth region, where N comprises an integer greater than 3, of the amorphous thin film laterally adjacent to the second single-crystalline thin film; and transforming the Nth region of the amorphous thin film into an Nth single-crystalline thin film including the single-crystalline material, by converting a crystalline structure of the Nth region of the amorphous thin film into a single-crystalline structure, using the single-crystalline material in an (N−1)th single-crystalline thin film as the seed during a phase transition of the Nth region of the amorphous thin film.

9. The method of claim 8, wherein the second region of the amorphous thin film has an area substantially larger than that of the Nth region of the amorphous thin film.

10. The method of claim 1, wherein the portion of the substrate exposed through the opening corresponds to a region for forming a common source line of the unit string.

11. A method of manufacturing a semiconductor device, comprising:

forming a first string structure including a selection transistor and a memory cell on a single-crystalline substrate;

forming a first insulation layer pattern on the single-crystalline substrate to cover the first string structure, the first insulation layer pattern including at least one opening exposing a portion of the single-crystalline substrate adjacent to the selection transistor;

forming a first seed layer including a single-crystalline material in the opening contacting the single-crystalline substrate;

forming an amorphous thin film on the first insulation layer pattern and the first seed layer;

transforming the amorphous thin film into a single-crystalline thin film, using the single-crystalline material in the first seed layer as a seed during a phase transition of the amorphous thin film, to provide a channel layer including the single-crystalline thin film on the first insulation layer pattern and the first seed layer;

removing the first seed layer from the first insulation layer pattern; and forming a conductive line including a conductive material in the opening, wherein transforming comprises:

changing a phase of a first region of the amorphous thin film, the first region of the amorphous thin film being overlapped with the seed layer;

transforming the first region of the amorphous thin film into a first single-crystalline thin film including the single-crystalline material, by converting a crystalline structure of the first region of the amorphous thin film into a single-crystalline structure, using the single-crystalline material in the seed layer as the seed during a phase transition of the first region of the amorphous thin film;

changing a phase of a second region of the amorphous thin film, the second region of the amorphous thin film being laterally adjacent to the first single-crystalline thin film; and transforming the second region of the amorphous thin film into a second single-crystalline thin film including the single-crystalline material, by converting a crystalline structure of the second region of the amorphous thin film into a single-crystalline structure, using the single-crystalline material in the first single-crystalline thin film as the seed during a phase transition of the second region of the amorphous thin film, and wherein the first region of the amorphous thin film has an area substantially larger than that of the second region of the amorphous thin film.

12. The method of claim 11, further comprising repeatedly forming second to Rth string structures, where R comprises an integer greater than 3, including a plurality of memory cells, second to Pth insulation layer patterns, where P comprises an integer greater than 3, including openings substantially the same as the first insulation layer pattern, second to Mth seed layers, where M comprises an integer greater than 3, substantially the same as the first seed layer, second to Kth amorphous thin films, where K comprises an integer greater than 3, substantially the same as the first amorphous thin film, and second to Jth channel layers, where J comprises an integer greater than 3, substantially the same as the first channel layer, on the first channel layer.

13. A method of manufacturing a semiconductor device, comprising:
- forming a first insulation layer pattern having a first opening on a single-crystalline substrate including a first memory cell structure;
- forming a seed layer including a single-crystalline material in the first opening contacting the single-crystalline substrate;
- forming a first amorphous thin film including an amorphous material on the first insulation layer pattern and the seed layer;
- changing a phase of the first amorphous thin film using the single-crystalline material in the seed layer as a seed to provide a first channel layer including the single-crystalline material on the first insulation layer pattern and the seed layer;
- forming a second insulation layer pattern including a second opening exposing the first channel layer on the first channel layer;
- forming a second amorphous thin film filling the second opening;
- transforming the second amorphous thin film into a single-crystalline structure by a laser epitaxial growth process using the first channel layer as a seed, to provide a second channel layer; and
- forming a second memory cell structure on the second channel layer,
- wherein the second opening has an aspect ratio of about 1:2 to about 1:5 to suppress defects in an upper portion of the second channel layer serving as an active region for the second memory cell structure.

14. The method of claim 13, further comprising:
- forming a third insulation layer pattern including a third opening exposing the second channel layer on the second channel layer;
- forming a third amorphous thin film filling the third opening;
- changing a phase of the third amorphous thin film, using the second channel layer as a seed during a phase transition of the third amorphous thin film, to provide a third channel layer having an upper portion free from the defects; and
- forming a third memory cell structure on the third channel layer.

15. The method of claim 14, further comprising repeatedly forming fourth to Pth (P is an integer greater than 5) insulation layer patterns including openings substantially the same as the third insulation layer pattern, fourth to Jth (J is an integer greater than 5) channel layers substantially the same as the third channel layer, and fourth to Kth (K is an integer greater than 5) memory cell structures substantially the same as the third memory cell structure, on the third channel layer.

16. The method of claim 13, wherein the second channel layer includes the lower portion having the defects transcribed from the defects with an orientation in a crystallographic <111> direction in an upper portion of the first channel layer, and the upper portion free from the defects.

17. A method of forming a semiconductor device, comprising:
- forming a string structure including a selection transistor and a memory cell on a substrate;
- forming a laterally seed grown single-crystalline thin film from a first amorphous thin film over the selection transistor and the memory cell to provide a single-crystalline material including defects having a crystallographic <111> orientation;
- forming an insulating layer pattern over the laterally seed grown single-crystalline thin film with openings therein, wherein the insulating layer pattern positions insulating portions thereof to intercept the defects grown from the laterally seed grown single-crystalline thin film;
- forming a second amorphous thin film filling the openings;
- transforming the second amorphous thin film into a single-crystalline structure, by a laser epitaxial growth process using the laterally seed grown single-crystalline thin film as a seed, to provide a channel layer; and
- forming a second memory cell structure on the channel layer,
- wherein the openings have an aspect ratio of about 1:2 to about 1:5 to suppress defects in an upper portion of the channel layer serving as an active region for the second memory cell structure.

* * * * *